(12) United States Patent
Onishi

(10) Patent No.: US 7,602,216 B2
(45) Date of Patent: Oct. 13, 2009

(54) INTEGRATED CIRCUIT DEVICE AND ELECTRONIC INSTRUMENT

(75) Inventor: Kota Onishi, Nagoya (JP)

(73) Assignee: Seiko Epson Corporation, Tokyo (JP)

( * ) Notice: Subject to any disclaimer, the term of this patent is extended or adjusted under 35 U.S.C. 154(b) by 42 days.

(21) Appl. No.: 12/071,366

(22) Filed: Feb. 20, 2008

(65) Prior Publication Data

US 2008/0197883 A1   Aug. 21, 2008

(30) Foreign Application Priority Data

Feb. 20, 2007   (JP)   ............................. 2007-039655

(51) Int. Cl.
*H03K 19/173*   (2006.01)
*H01F 38/14*   (2006.01)

(52) U.S. Cl. ........................... 326/47; 326/101; 326/83; 326/82; 307/104

(58) Field of Classification Search ................... 326/47, 326/101, 82, 83
See application file for complete search history.

(56) References Cited

U.S. PATENT DOCUMENTS

| 5,291,043 A | | 3/1994 | Arakawa | |
|---|---|---|---|---|
| 5,404,035 A | | 4/1995 | Taniguchi et al. | |
| 5,552,618 A | | 9/1996 | Taniguchi et al. | |
| 5,621,342 A | * | 4/1997 | Wong et al. | 327/108 |
| 5,781,045 A | * | 7/1998 | Walia et al. | 327/108 |
| 5,949,268 A | * | 9/1999 | Miura et al. | 327/278 |
| 6,262,599 B1 | * | 7/2001 | Coughlin et al. | 326/81 |
| 6,593,795 B2 | * | 7/2003 | Cho | 327/333 |
| 6,815,276 B2 | * | 11/2004 | Hower et al. | 438/197 |
| 7,019,362 B2 | | 3/2006 | Sakamoto et al. | |
| 7,187,034 B2 | * | 3/2007 | Hower et al. | 257/341 |
| 7,215,146 B2 | * | 5/2007 | Khan | 326/83 |
| 7,362,127 B2 | | 4/2008 | Tokuhiro et al. | |

(Continued)

FOREIGN PATENT DOCUMENTS

JP   A-03-232273   10/1991

(Continued)

OTHER PUBLICATIONS

U.S. Appl. No. 12/071,369, filed Feb. 20, 2008 in the name of Mikimoto Jin et al.

(Continued)

*Primary Examiner*—Vibol Tan
(74) *Attorney, Agent, or Firm*—Oliff & Berridge PLC

(57)   ABSTRACT

An integrated circuit device includes a first predriver that drives an N-type power MOS transistor of an external driver including the N-type power MOS transistor and a P-type power MOS transistor, a second predriver that drives the P-type power MOS transistor, a low-potential-side power supply pad, a first output pad, a second output pad, and a high-potential-side power supply pad. The low-potential-side power supply pad, the first output pad, the second output pad, and the high-potential-side power supply pad are disposed along a first direction. The first predriver is disposed in a second direction with respect to the low-potential-side power supply pad and the first output pad, the second direction being a direction that is perpendicular to the first direction, and the second predriver is disposed in the second direction with respect to the second output pad and the high-potential-side power supply pad.

19 Claims, 13 Drawing Sheets

U.S. PATENT DOCUMENTS

| | | | |
|---|---|---|---|
| 7,417,838 B2 * | 8/2008 | Ito et al. | 361/56 |
| 7,463,051 B2 * | 12/2008 | Bartolini et al. | 326/26 |
| 2002/0030516 A1 * | 3/2002 | Bellomo et al. | 327/108 |
| 2007/0252638 A1 * | 11/2007 | Aquil et al. | 327/513 |

FOREIGN PATENT DOCUMENTS

| | | |
|---|---|---|
| JP | A-05-343648 | 12/1993 |
| JP | A 06-21330 | 1/1994 |
| JP | A-2004-260026 | 9/2004 |
| JP | A-2006-042137 | 2/2006 |
| JP | A 2006-60909 | 3/2006 |

OTHER PUBLICATIONS

U.S. Appl. No. 12/071,370, filed Feb. 20, 2008 in the name of Kota Onishi et al.

U.S. Appl. No. 12/071,371, filed Feb. 20, 2008 in the name of Mikimoto Jin.

* cited by examiner

FIG. 1
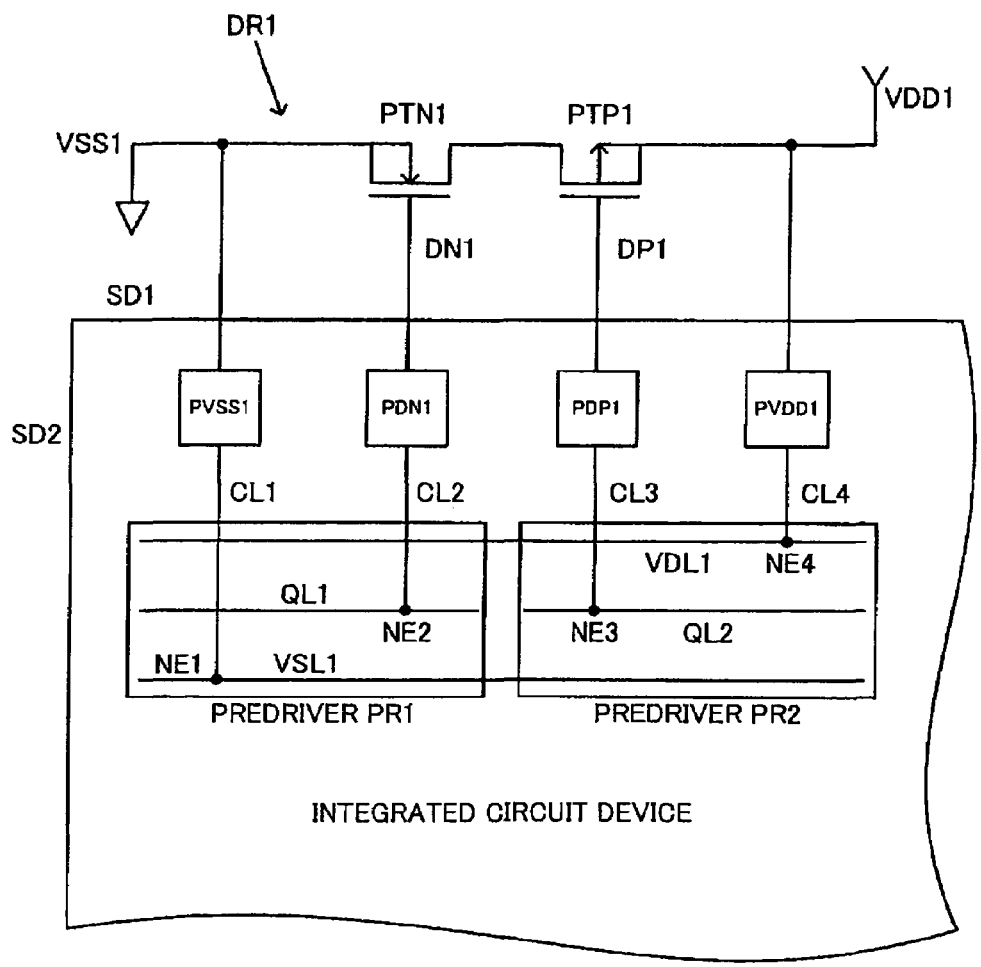
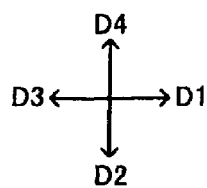

INTEGRATED CIRCUIT DEVICE AND ELECTRONIC INSTRUMENT

Japanese Patent Application No. 2007-39655 filed on Feb. 20, 2007, is hereby incorporated by reference in its entirety.

BACKGROUND OF THE INVENTION

The present invention relates to an integrated circuit device, an electronic instrument, and the like.

In recent years, non-contact power transmission (contactless power transmission) has attracted attention which utilizes electromagnetic induction to enable power transmission without metal-to-metal contact. As application examples of non-contact power transmission, charging a portable telephone, a household appliance (e.g., telephone handset), and the like has been proposed.

Patent Document 1 (JP-A-2006-60909) discloses related-art non-contact power transmission. In Patent Document 1, a resonant circuit is formed using a capacitor connected to an output of a power transmission driver and a primary coil so that power is supplied from a power transmission device (primary side) to a power reception device (secondary side). Patent Document 2 (JP-A-6-21330) discloses a related-art semiconductor power module.

A power transmission driver (external driver) which drives a primary coil may be formed using an external N-type power MOS transistor and P-type power MOS transistor, for example. The N-type and P-type power MOS transistors (MOSFET) have a large size and a large parasitic capacitor. Therefore, in order to reduce a power transmission loss and deal with high-frequency drive, a predriver of an integrated circuit device (power transmission control device) which controls the power transmission driver is required to be able to promptly charge/discharge the parasitic capacitor of the power MOS transistor. When a period in which the N-type and P-type power MOS transistors are simultaneously turned ON occurs, a shoot-through current flows from a high-potential-side power supply to a low-potential-side power supply through these transistors.

SUMMARY

According to one aspect of the invention, there is provided an integrated circuit device comprising:

a first predriver that drives an N-type power MOS transistor of an external driver including the N-type power MOS transistor and a P-type power MOS transistor;

a second predriver that drives the P-type power MOS transistor of the external driver;

a low-potential-side power supply pad, a low-potential-side power supply voltage being supplied to the first predriver and the second predriver through the low-potential-side power supply pad;

a first output pad, an output signal from the first predriver being output through the first output pad;

a second output pad, an output signal from the second predriver being output through the second output pad; and a high-potential-side power supply pad, a high-potential-side power supply voltage being supplied to the first predriver and the second predriver through the high-potential-side power supply pad, the low-potential-side power supply pad, the first output pad, the second output pad, and the high-potential-side power supply pad being disposed along a first direction;

the first predriver being disposed in a second direction with respect to the low-potential-side power supply pad and the first output pad, the second direction being a direction that is perpendicular to the first direction; and the second predriver being disposed in the second direction with respect to the second output pad and the high-potential-side power supply pad.

According to another aspect of the invention, there is provided an integrated circuit device comprising:

a first predriver that drives an N-type power MOS transistor of an external driver including the N-type power MOS transistor and a P-type power MOS transistor;

a second predriver that drives the P-type power MOS transistor of the external driver;

a third predriver that drives a second N-type power MOS transistor of a second external driver including the second N-type power MOS transistor and a second P-type power MOS transistor;

a fourth predriver that drives the second P-type power MOS transistor of the second external driver;

a first output pad, an output signal from the first predriver being output through the first output pad;

a second output pad, an output signal from the second predriver being output through the second output pad;

a third output pad, an output signal from the third predriver being output through the third output pad; and a fourth output pad, an output signal from the fourth predriver being output through the fourth output pad, the first predriver and the second predriver being disposed along a first side of the integrated circuit device, the first side being a side of the integrated circuit device along a first direction; and the third predriver and the fourth predriver being disposed along a second side of the integrated circuit device, the second side being a side of the integrated circuit device along a second direction that is perpendicular to the first direction.

According to another aspect of the invention, there is provided an integrated circuit device comprising:

a driver that drives an external device;

a low-potential-side power supply pad, a low-potential-side power supply voltage being supplied to the driver through the low-potential-side power supply pad;

an output pad, an output signal from the driver being output through the output pad; and a high-potential-side power supply pad, a high-potential-side power supply voltage being supplied to the driver through the high-potential-side power supply pad, the low-potential-side power supply pad, the output pad, and the high-potential-side power supply pad being disposed along a first direction;

the driver being disposed in a second direction with respect to the low-potential-side power supply pad, the output pad, and the high-potential-side power supply pad, the second direction being a direction perpendicular to the first direction;

a P-type transistor and an N-type transistor that form the driver being disposed along the second direction in an arrangement region of the driver;

each of the N-type transistor and the P-type transistor including a plurality of unit transistors that are connected in parallel; and the integrated circuit device further including:

an N-type gate control circuit that outputs a plurality of gate control signals that are respectively input to gates of the plurality of unit transistors of the N-type transistor; and a P-type gate control circuit that outputs a plurality of gate control signals that are respectively input to gates of the plurality of unit transistors of the P-type transistor.

According to another aspect of the invention, there is provided an electronic instrument comprising:
the above integrated circuit device; and
a device that is driven by the integrated circuit device.

BRIEF DESCRIPTION OF THE SEVERAL
VIEWS OF THE DRAWING

FIG. 1 shows an arrangement configuration example of an integrated circuit device according to one embodiment of the invention.

Figure 2A:
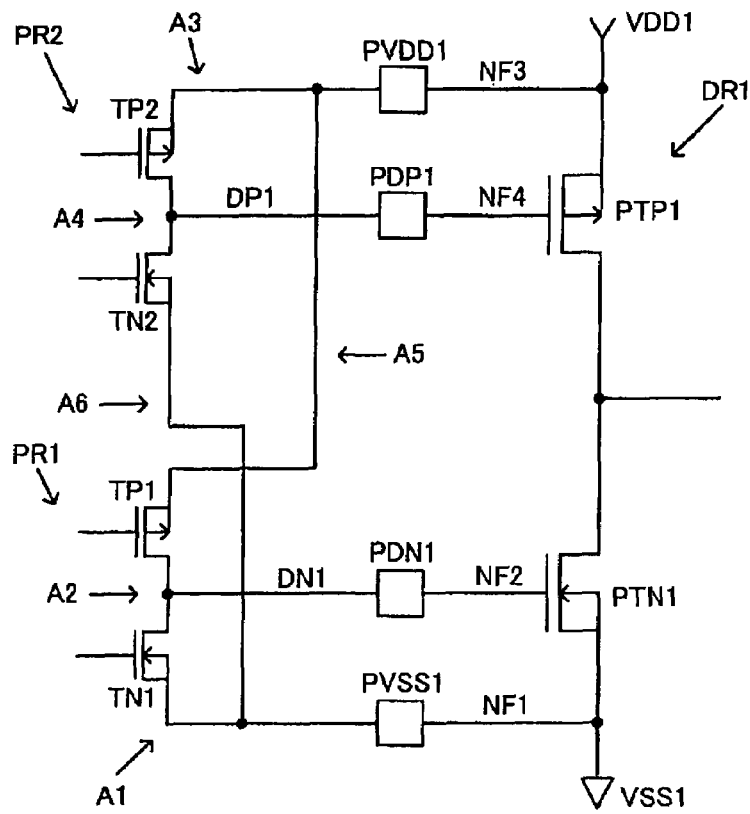
FIGS. 2A and 2B are views illustrative of an external driver, a predriver, and a unit transistor.

DETAILED DESCRIPTION OF THE
EMBODIMENT

Some aspects of the invention may provide an integrated circuit device which can efficiently and stably drive an external device, and an electronic instrument including the same.

According to one embodiment of the invention, there is provided an integrated circuit device comprising:
a first predriver that drives an N-type power MOS transistor of an external driver including the N-type power MOS transistor and a P-type power MOS transistor;
a second predriver that drives the P-type power MOS transistor of the external driver;
a low-potential-side power supply pad, a low-potential-side power supply voltage being supplied to the first predriver and the second predriver through the low-potential-side power supply pad;
a first output pad, an output signal from the first predriver being output through the first output pad;
a second output pad, an output signal from the second predriver being output through the second output pad; and
a high-potential-side power supply pad, a high-potential-side power supply voltage being supplied to the first predriver and the second predriver through the high-potential-side power supply pad,
the low-potential-side power supply pad, the first output pad, the second output pad, and the high-potential-side power supply pad being disposed along a first direction;
the first predriver being disposed in a second direction with respect to the low-potential-side power supply pad and the first output pad, the second direction being a direction that is perpendicular to the first direction; and
the second predriver being disposed in the second direction with respect to the second output pad and the high-potential-side power supply pad.

According to this embodiment, the first predriver is disposed in the second direction with respect to the low-potential-side power supply pad and the first output pad, and the second predriver is disposed in the second direction with respect to the second output pad and the high-potential-side power supply pad. Therefore, since the length of a line provided from the low-potential-side power supply pad to the first predriver and the length of a line provided from the high-potential-side power supply pad to the second predriver can be reduced, the parasitic resistance of these lines can be reduced. This makes it possible to stably and efficiently drive the external driver.

In the integrated circuit device according to this embodiment,
the integrated circuit device may further include:
a low-potential-side power supply line that supplies the low-potential-side power supply voltage to the first predriver and the second predriver, the low-potential-side power supply line being provided along the first direction in arrangement regions of the first predriver and the second predriver;
a first connection line that connects the low-potential-side power supply pad and the low-potential-side power supply line, the first connection line being provided along the second direction from the low-potential-side power supply pad to a low-potential-side power supply connection node of the first predriver;
a first output line that is connected to an output of the first predriver, the first output line being provided along the first direction in the arrangement region of the first predriver;
a second connection line that connects the first output pad and the first output line, the second connection line being provided along the second direction from the first output pad to an output connection node of the first predriver;
a second output line that is connected to an output of the second predriver, the second output line being provided along the first direction in the arrangement region of the second predriver;
a third connection line that connects the second output pad and the second output line, the third connection line being provided along the second direction from the second output pad to an output connection node of the second predriver;
a high-potential-side power supply line that supplies the high-potential-side power supply voltage to the first predriver and the second predriver, the high-potential-side power supply line being provided along the first direction in the arrangement regions of the first predriver and the second predriver; and
a fourth connection line that connects the high-potential-side power supply pad and the high-potential-side power supply line, the fourth connection line being provided along the second direction from the high-potential-side power supply pad to a high-potential-side power supply connection node of the second predriver.

This makes it possible to supply the low-potential-side power supply voltage and the high-potential-side power supply voltage to the first predriver and the second predriver through short lines. Moreover, the output signals from the first predriver and the second predriver can be output through short lines. As a result, the parasitic resistances of these lines can be reduced, whereby a shoot-through current, overshoot noise, and the like can be reduced.

In the integrated circuit device according to this embodiment, a low-potential-side power supply line and a high-potential-side power supply line of the first predriver and the second predriver may be separated from a low-potential-side power supply line and a high-potential-side power supply line of other circuits of the integrated circuit device.

This prevents a situation in which noise produced by the first predriver and the second predriver is transmitted to other circuits through the low-potential-side power supply line and the high-potential-side power supply line.

In the integrated circuit device according to this embodiment, an electrostatic discharge protection region may be provided between a region that includes the low-potential-side power supply pad, the first output pad, the second output pad, and the high-potential-side power supply pad and a region that includes the first predriver and the second predriver, a predriver electrostatic discharge protection element being disposed in the electrostatic discharge protection region;

an electrostatic discharge protection low-potential-side power supply line may be provided along the first direction in the electrostatic discharge protection region, the electrostatic discharge protection low-potential-side power supply line being connected to the low-potential-side power supply pad and supplying the low-potential-side power supply voltage to the predriver electrostatic discharge protection element;

an electrostatic discharge protection high-potential-side power supply line may be provided along the first direction in the electrostatic discharge protection region, the electrostatic discharge protection high-potential-side power supply line being connected to the high-potential-side power supply pad and supplying the high-potential-side power supply voltage to the predriver electrostatic discharge protection element; and the electrostatic discharge protection low-potential-side power supply line and the electrostatic discharge protection high-potential-side power supply line may be separated from an electrostatic discharge protection low-potential-side power supply line and an electrostatic discharge protection high-potential-side power supply line of other circuits of the integrated circuit device.

This prevents a situation in which noise produced by the first predriver and the second predriver is transmitted to other circuits through the electrostatic discharge protection low-potential-side power supply line and the electrostatic discharge protection high-potential-side power supply line.

In the integrated circuit device according to this embodiment, a first P-type transistor and a first N-type transistor that form the first predriver may be disposed along the second direction in an arrangement region of the first predriver; and a second P-type transistor and a second N-type transistor that form the second predriver may be disposed along the second direction in an arrangement region of the second predriver.

This makes it possible to arrange the first predriver and the second predriver with a small layout.

In the integrated circuit device according to this embodiment, each of the first N-type transistor, the first P-type transistor, the second N-type transistor, and the second P-type transistor may include a plurality of unit transistors that are connected in parallel; and the integrated circuit device may further include:

a first N-type gate control circuit that outputs a plurality of gate control signals that are respectively input to gates of the plurality of unit transistors of the first N-type transistor;

a first P-type gate control circuit that outputs a plurality of gate control signals that are respectively input to gates of the plurality of unit transistors of the first P-type transistor;

a second N-type gate control circuit that outputs a plurality of gate control signals that are respectively input to gates of the plurality of unit transistors of the second N-type transistor; and a second P-type gate control circuit that outputs a plurality of gate control signals that are respectively input to gates of the plurality of unit transistors of the second P-type transistor.

This enables the first N-type transistor, the first P-type transistor, the second N-type transistor, and the second P-type transistor to be minutely ON/OFF-controlled using the gate control signals.

In the integrated circuit device according to this embodiment, the first N-type gate control circuit may output gate control signals that turn ON the plurality of unit transistors of the first N-type transistor at different timings when the first N-type transistor turns ON, the first N-type gate control circuit outputting gate control signals that turn OFF the plurality of unit transistors of the first N-type transistor at the same timing when the first N-type transistor turns OFF;

the first P-type gate control circuit may output gate control signals that turn ON the plurality of unit transistors of the first P-type transistor at different timings when the first P-type transistor turns ON, and the first P-type gate control circuit may output gate control signals that turn OFF the plurality of unit transistors of the first P-type transistor at the same timing when the first P-type transistor turns OFF;

the second N-type gate control circuit may output gate control signals that turn ON the plurality of unit transistors of the second N-type transistor at different timings when the second N-type transistor turns ON, and the second N-type gate control circuit may output gate control signals that turn OFF the plurality of unit transistors of the second N-type transistor at the same timing when the second N-type transistor turns OFF; and the second P-type gate control circuit may output gate control signals that turn ON the plurality of unit transistors of the second P-type transistor at different timings when the second P-type transistor turns ON, and the second P-type gate control circuit may output gate control signals that turn OFF the plurality of unit transistors of the second P-type transistor at the same timing when the second P-type transistor turns OFF.

This reduces overshoot noise produced when the first N-type transistor, the first P-type transistor, the second N-type transistor, and the second P-type transistor are turned ON while preventing occurrence of a shoot-through current.

In the integrated circuit device according to this embodiment, one of the first N-type gate control circuit and the first P-type gate control circuit may be disposed in the second direction with respect to the plurality of unit transistors of the first N-type transistor and the plurality of unit transistors of the first P-type transistor, and the other of the first N-type gate control circuit and the first P-type gate control circuit may be disposed in a fourth direction with respect to the plurality of unit transistors of the first N-type transistor and the plurality of unit transistors of the first P-type transistor, the fourth direction being a direction that is opposite to the second direction; and one of the second N-type gate control circuit and the second P-type gate control circuit may be disposed in the second direction with respect to the plurality of unit transistors of the second N-type transistor and the plurality of unit transistors of the second P-type transistor, and the other of the second N-type gate control circuit and the second P-type gate control circuit may be disposed in the fourth direction with respect to the plurality of unit transistors of the second N-type transistor and the plurality of unit transistors of the second P-type transistor.

This enables the gate control signal from the gate control circuit to be supplied to the unit transistor along a short path, whereby layout efficiency can be increased. Moreover, the parasitic resistance of the gate control signal line can be reduced, for example.

In the integrated circuit device according to this embodiment, the integrated circuit device may further include:

a third predriver that drives a second N-type power MOS transistor of a second external driver including the second N-type power MOS transistor and a second P-type power MOS transistor; and a fourth predriver that drives the second P-type power MOS transistor of the second external driver, the first predriver and the second predriver may be disposed along a first side of the integrated circuit device, the first side being a side of the integrated circuit device along the first direction; and the third predriver and the fourth predriver may be disposed along a second side of the integrated circuit device, the second side being a side of the integrated circuit device along the second direction.

According to another embodiment of the invention, there is provided an integrated circuit device comprising:

a first predriver that drives an N-type power MOS transistor of an external driver including the N-type power MOS transistor and a P-type power MOS transistor;

a second predriver that drives the P-type power MOS transistor of the external driver;

a third predriver that drives a second N-type power MOS transistor of a second external driver including the second N-type power MOS transistor and a second P-type power MOS transistor;

a fourth predriver that drives the second P-type power MOS transistor of the second external driver;

a first output pad, an output signal from the first predriver being output through the first output pad;

a second output pad, an output signal from the second predriver being output through the second output pad;

a third output pad, an output signal from the third predriver being output through the third output pad; and a fourth output pad, an output signal from the fourth predriver being output through the fourth output pad, the first predriver and the second predriver being disposed along a first side of the integrated circuit device, the first side being a side of the integrated circuit device along a first direction; and the third predriver and the fourth predriver being disposed along a second side of the integrated circuit device, the second side being a side of the integrated circuit device along a second direction that is perpendicular to the first direction.

According to this embodiment, the first predriver and the second predriver are disposed along the first side of the integrated circuit device, and the third predriver and the fourth predriver are disposed along the second side of the integrated circuit device. Therefore, the first to fourth predrivers can be collectively disposed in the corner area of the integrated circuit device formed by the first and second sides. Accordingly, the first to fourth predriver can be easily separated from other circuits with regard to the power supply or the like, whereby an adverse effect of noise produced by the first to fourth predrivers on other circuits can be suppressed.

In the integrated circuit device according to this embodiment, the integrated circuit device may further include a control logic circuit that controls the first predriver, the second predriver, the third predriver, and the fourth predriver, the control logic circuit being disposed in the second direction with respect to the first predriver and the second predriver and in the first direction with respect to the third predriver and the fourth predriver.

This enables the signal lines to be provided between the control logic circuit and the first and second predrivers along short paths, whereby layout efficiency can be increased.

In the integrated circuit device according to this embodiment, the integrated circuit device may be provided in a power transmission device of a non-contact power transmission system, the non-contact power transmission system transmitting power from the power transmission device to a power reception device by electromagnetically coupling a primary coil and a secondary coil and supplying power to a load of the power reception device, the external driver may be a first power transmission driver that drives one end of the primary coil; and the second external driver may be a second power transmission driver that drives the other end of the primary coil.

This enables the first and second power transmission drivers of the non-contact power transmission system to be driven efficiently, whereby an increase in power transmission efficiency and the like can be achieved.

According to another embodiment of the invention, there is provided an integrated circuit device comprising:

a driver that drives an external device;

a low-potential-side power supply pad, a low-potential-side power supply voltage being supplied to the driver through the low-potential-side power supply pad;

an output pad, an output signal from the driver being output through the output pad; and a high-potential-side power supply pad, a high-potential-side power supply voltage being supplied to the driver through the high-potential-side power supply pad, the low-potential-side power supply pad, the output pad, and the high-potential-side power supply pad being disposed along a first direction;

the driver being disposed in a second direction with respect to the low-potential-side power supply pad, the output pad, and the high-potential-side power supply pad, the second direction being a direction perpendicular to the first direction;

a P-type transistor and an N-type transistor that form the driver being disposed along the second direction in an arrangement region of the driver;

each of the N-type transistor and the P-type transistor including a plurality of unit transistors that are connected in parallel; and the integrated circuit device further including:

an N-type gate control circuit that outputs a plurality of gate control signals that are respectively input to gates of the plurality of unit transistors of the N-type transistor; and a P-type gate control circuit that outputs a plurality of gate control signals that are respectively input to gates of the plurality of unit transistors of the P-type transistor.

According to this embodiment, the low-potential-side power supply pad, the output pad, and the high-potential-side power supply pad are disposed along the first direction, and the driver is disposed in the second direction with respect to the low-potential-side power supply pad, the output pad, and the high-potential-side power supply pad. Therefore, since the length of a line provided from the low-potential-side power supply pad to the driver and the length of a line provided from the high-potential-side power supply pad to the driver can be reduced, the parasitic resistance of these lines can be reduced. This makes it possible to stably and efficiently drive the external driver.

In the integrated circuit device according to this embodiment, the N-type gate control circuit may output gate control signals that turn ON the plurality of unit transistors of the N-type transistor at different timings when the N-type transistor turns ON, and the N-type gate control circuit may output bate control signals that turn OFF the plurality of unit transistors of the N-type transistor at the same timing when the N-type transistor turns OFF; and the P-type gate control circuit may output gate control signals that turn ON the plurality of unit transistors of the P-type transistor at different timings when the P-type transistor turns ON, and the P-type gate control circuit may output gate control signals those turn OFF the plurality of unit transistors of the P-type transistor at the same timing when the P-type transistor turns OFF.

According to this configuration, overshoot noise which occurs when the N-type transistor and the P-type transistor are turned ON can be reduced while preventing occurrence of a shoot-through current.

In the integrated circuit device according to this embodiment, one of the N-type gate control circuit and the P-type gate control circuit may be disposed in the second direction with respect to the plurality of unit transistors of the N-type transistor and the plurality of unit transistors of the P-type transistor, and the other of the N-type gate control circuit and the P-type gate control circuit may be disposed in a fourth direction with respect to the plurality of unit transistors of the N-type transistor and the plurality of unit transistors of the P-type transistor, the fourth direction being a direction opposite to the second direction.

This enables the gate control signal from the gate control circuit to be supplied to the unit transistor along a short path, whereby layout efficiency can be increased. Moreover, the parasitic resistance of the gate control signal line can be reduced, for example.

According to another embodiment of the invention, there is provided an electronic instrument comprising:

one of the above integrated circuit devices; and a device that is driven by the integrated circuit device.

Preferred embodiments of the invention are described in detail below. Note that the embodiments described below do not in any way limit the scope of the invention defined by the claims laid out herein. Note that all elements of the embodiments described below should not necessarily be taken as essential requirements for the invention.

1. Predriver

FIG. 1 shows an arrangement configuration example of an integrated circuit device and a predriver according to one embodiment of the invention. In FIG. 1, a direction along a first side SD1 of the integrated circuit device is referred to as a first direction D1, and a direction perpendicular to the first direction is referred to as a second direction D2. A direction opposite to the first direction D1 is referred to as a third direction D3, and a direction opposite to the second direction D2 is referred to as a fourth direction D4. FIG. 1 shows an example in which the direction D1 is a rightward direction and the direction D3 is a leftward direction. Note that the direction D1 may be a leftward direction and the direction D3 may be a rightward direction. FIG. 1 shows an example in which the direction D2 is a downward direction and the direction D4 is an upward direction. Note that the direction D2 may be an upward direction and the direction D4 may be a downward direction.

The integrated circuit device shown in FIG. 1 includes first and second predrivers PR1 and PR2. The integrated circuit device also includes a low-potential-side power supply pad PVSS1, a first output pad PDN1, a second output pad PDP1, and a high-potential-side power supply pad PVDD1. These pads (electrodes or terminals) are disposed along the first side SD1 of the integrated circuit device, for example.

An external driver DR1 is provided outside the integrated circuit device. The external driver DR1 includes an N-type power MOS transistor PTN1 (N-type transistor or N-type MOS transistor in a broad sense) and a P-type power MOS transistor PTP1 (P-type transistor or P-type MOS transistor in a broad sense) as external parts. Specifically, a high-potential-side power supply voltage VDD1 is supplied to the source of the transistor PTP1, a low-potential-side power supply VSS1 is supplied to the source of the transistor PTN1, and the drain of the transistor PTP1 is connected to the drain of the transistor PTN1. The external driver DR1 may be various drivers such as a power transmission driver which drives a primary coil in non-contact power transmission or a motor driver which drives a motor.

The predriver PR1 drives the N-type power MOS transistor PTN1 of the external driver DR1. Specifically, an inverter circuit which includes an N-type transistor and a P-type transistor may be used as the predriver PR1. An output signal DN1 from the predriver PR1 is input to the gate of the N-type power MOS transistor PTN1 through the output pad PDN1 so that the transistor PTN1 is ON/OFF-controlled.

The predriver PR2 drives the P-type power MOS transistor PTP1 of the external driver DR1. Specifically, an inverter circuit which includes an N-type transistor and a P-type transistor may be used as the predriver PR2. An output signal DP1 from the predriver PR2 is input to the gate of the P-type power MOS transistor PTP1 through the output pad PDP1 so that the transistor PTP1 is ON/OFF-controlled.

The output signals DN1 and DP1 are non-overlap signals of which the active periods do not overlap. This prevents a situation in which a shoot-through current flows from the power supply VDD1 to the power supply VSS1 through the transistors PTP1 and PTN1.

The power supply pad PVSS1 is a pad through which a low-potential-side power supply voltage VSS1 is supplied to the predrivers PR1 and PR2. Specifically, a low-potential-side power supply line VSL1 of the predrivers PR1 and PR2 is connected to the power supply pad PVSS1 via a first connection line CL1. The power supply voltage VSS1 is also used as a low-potential-side power supply voltage of the external driver DR1. A power supply line of the power supply voltage VSS1 is connected to the source of the transistor PTN1 using a line provided on the circuit board.

The pad PDN1 is a pad through which the output signal DN1 from the predriver PR1 is output. Specifically, a first output line QL1 of the predriver PR1 is connected to the pad PDN1 through a second connection line CL2, and the signal DN1 is output to the outside through the first output line QL1, the second connection line CL2, and the pad PDN1.

The pad PDP1 is a pad through which the output signal DP1 from the predriver PR2 is output. Specifically, a second output line QL2 of the predriver PR2 is connected to the pad PDP1 through a third connection line CL3, and the signal DP1 is output to the outside through the second output line QL2, the third connection line CL3, and the pad PDP1.

The power supply pad PVDD1 is a pad through which a high-potential-side power supply VDD1 is supplied to the predrivers PR1 and PR2. Specifically, a high-potential-side power supply line VDL1 of the predrivers PR1 and PR2 is connected to the power supply pad PVDD1 through a fourth connection line CL4. The power supply voltage VDD1 is also used as a high-potential-side power supply voltage of the external driver DR1. A power supply line of the power supply voltage VDD1 is connected to the source of the transistor PTP1 using a line on the circuit board.

In this embodiment, the low-potential-side power supply pad PVSS1, the first and second output pads PDN1 and PDP1, and the high-potential-side power supply pad PVDD1 are disposed along the direction D1, as shown in FIG. 1. Specifically, the output pad PDN1 is disposed in the direction D1 with respect to the power supply pad PVSS1, the output pad PDP1 is disposed in the direction D1 with respect to the output pad PDN1, and the power supply pad PVDD1 is disposed in the direction D1 with respect to the output pad PDP1.

When a direction perpendicular to the direction D1 is referred to as the direction D2, the predriver PR1 is disposed in the direction D2 with respect to the power supply pad PVSS1 and the output pad PDN1. The predriver PR2 is disposed in the direction D2 with respect to the output pad PDP1 and the power supply pad PVDD1.

FIG. 2A shows a circuit configuration example of the predrivers PR1 and PR2. The predriver PR1 includes a P-type transistor TP1 and an N-type transistor TN1. The power supply voltage VDD1 is supplied to the source of the transistor TP1, and the power supply voltage VSS1 is supplied to the source of the transistor TN1. The predriver PR2 includes a P-type transistor TP2 and an N-type transistor TN2. The power supply voltage VDD1 is supplied to the source of the transistor TP2, and the power supply voltage VSS1 is supplied to the source of the transistor TN2.

The power MOS transistors PTP1 and PTN1 of the external driver DR1 have a very large transistor size. Therefore, a very large shoot-through current flows when a period in which the transistors PTP1 and PTN1 are simultaneously turned ON occurs. Accordingly, the transistor PTN1 must be reliably turned OFF when the output signal DP1 from the predriver PR2 is set at the L level so that the transistor PTP1 is turned ON. In order to reliably turn OFF the transistor PTN1, nodes NF1 and NF2 must be set at the same potential. Therefore, it is desirable to minimize the parasitic resistances of lines indicated by A1 and A2.

Likewise, the transistor PTP1 must be reliably turned OFF when the output signal DN1 from the predriver PR1 is set at the H level so that the transistor PTN1 is turned ON. Therefore, nodes NF3 and NF4 must be set at the same potential. Accordingly, it is desirable to minimize the parasitic resistances of lines indicated by A3 and A4.

In this embodiment, the pads PVSS1, PDN1, PDP1, and PVDD1 are provided in that order along the direction D1, as shown in FIG. 1. The predriver PR1 is disposed in the direction D2 with respect to the pads PVSS1 and PDN1, and the predriver PR2 is disposed in the direction D2 with respect to the pads PDP1 and PVDD1. Therefore, the length of the line from the pad PVSS1 to the predriver PR1 and the length of the line from the pad PDN1 to the predriver PR1 can be reduced, whereby the parasitic resistances of the lines indicated by A1 and A2 in FIG. 2A can be minimized. This enables the transistor PTN1 to be reliably turned OFF in a period in which the transistor PTP1 is turned ON, whereby occurrence of a shoot-through current can be prevented.

Likewise, the length of the line from the pad PVDD1 to the predriver PR2 and the length of the line from the pad PDP1 to the predriver PR2 can be reduced, whereby the parasitic resistances of the lines indicated by A3 and A4 in FIG. 2A can be minimized. This enables the transistor PTP1 to be reliably turned OFF in a period in which the transistor PTN1 is turned ON, whereby occurrence of a shoot-through current can be prevented.

According to the arrangement configuration shown in FIG. 1, since the area occupied by the pads PVSS1, PDN1, PDP1, and PVDD1 and the predrivers PR1 and PR2 in the direction D2 can be reduced, layout efficiency can be increased.

According to the arrangement configuration shown in FIG. 1, since it is easy to mount the power MOS transistors PTN1 and PTP1 of the external driver DR1 on the circuit board and to provide the lines on the circuit board, a reduction in noise and a reduction in size of the circuit board can be achieved.

Figure 2B:
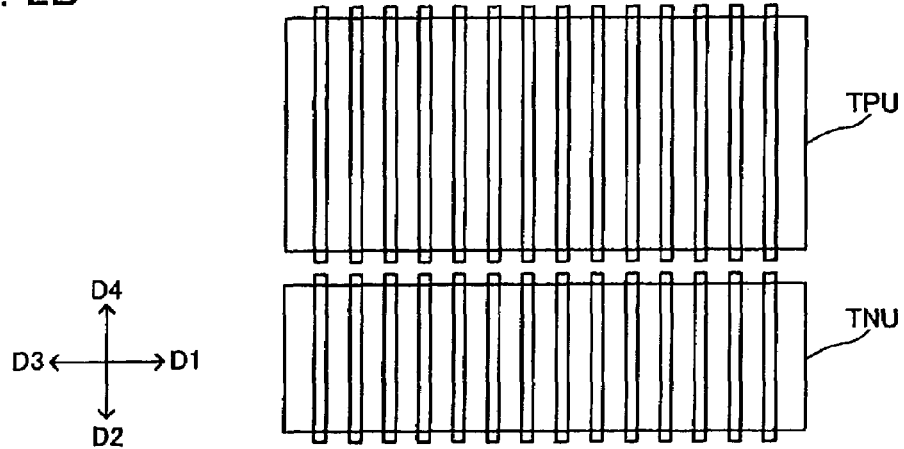
Figure 3:
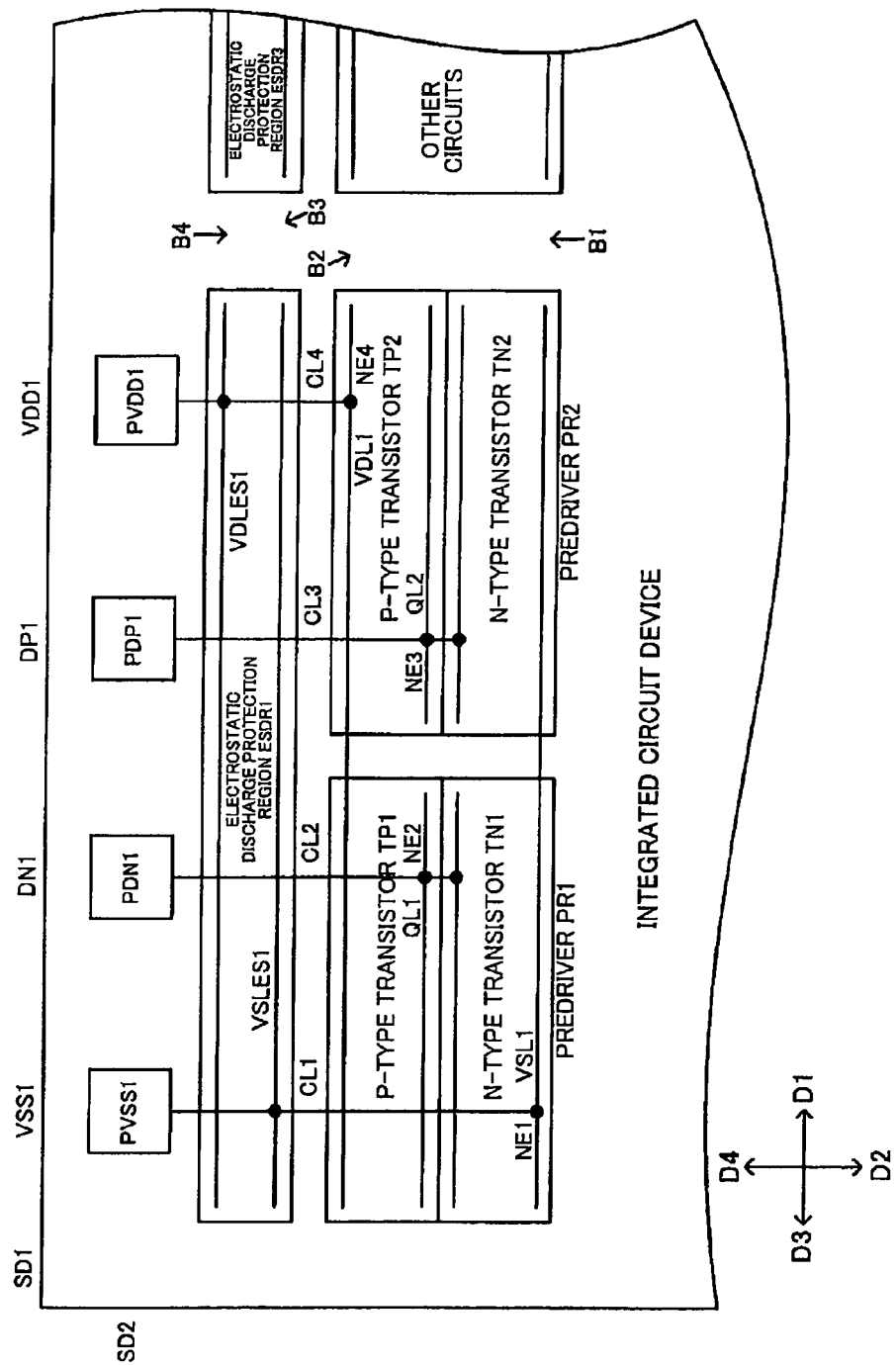
FIG. 3 shows a detailed arrangement configuration example of a predriver.

FIG. 3 shows a detailed arrangement configuration example of the integrated circuit device and the predriver according to this embodiment. As shown in FIG. 3, the first P-type transistor TP1 and the first N-type transistor TN1 of the first predriver PR1 are disposed along the direction D2 in the arrangement region of the first predriver PR1. Specifically, the transistors TP1 and TN1 are adjacently disposed along the direction D2. The second P-type transistor TP2 and the second N-type transistor TN2 of the second predriver PR2 are disposed along the direction D2 in the arrangement region of the second predriver PR2. Specifically, the transistors TP2 and TN2 are adjacently disposed along the direction D2. The gates of the transistors TP1, TN1, TP2, and TN2 are provided along the direction D2, as shown in FIG. 2B.

FIG. 3 shows an example in which the P-type transistor and the N-type transistor are disposed in that order along the direction D2. Note that the N-type transistor and the P-type transistor may be disposed in that order along the direction D2.

In FIG. 3, the low-potential-side power supply line VSL1 which supplies the low-potential-side power supply voltage VSS1 to the predrivers PR1 and PR2 is provided in the arrangement regions of the predrivers PR1 and PR2 along the direction D1. The first connection line CL1 (lead line) which connects the low-potential-side power supply pad PVSS1 and the low-potential-side power supply line VSL1 is provided from the power supply pad PVSS1 to a low-potential-side power supply connection node NE1 of the predriver PR1 along the direction D2.

The first output line QL1 connected to the output of the predriver PR1 is provided in the arrangement region of the predriver PR1 along the direction D1. The second connection line CL2 which connects the first output pad PDN1 and the first output line QL1 is provided from the first output pad PDN1 to an output connection node NE2 of the predriver PR1 along the direction D2.

The second output line QL2 connected to the output of the predriver PR2 is provided in the arrangement region of the predriver PR2 along the direction D1. The third connection line CL3 which connects the second output pad PDP1 and the second output line QL2 is provided from the second output pad PDP1 to an output connection node NE3 of the predriver PR2 along the direction D2.

The high-potential-side power supply line VDL1 which supplies the high-potential-side power supply voltage VDD1 to the predrivers PR1 and PR2 is provided in the arrangement regions of the predrivers PR1 and PR2 along the direction D1. The fourth connection line CL4 which connects the highpotential-side power supply pad PVDD1 and the high-potential-side power supply line VDL1 is provided from the high-potential-side power supply pad PVDD1 to a high-potential-side power supply line connection node NE4 of the predriver PR2 along the direction D2.

Note that the connection lines CL1, CL2, CL3, and CL4 may be at least partially provided linearly along the direction D2. For example, the connection lines CL1, CL2, CL3, and CL4 may have a portion provided along the direction D1. The positions of the connection nodes NE1, NE2, NE3, and NE4 are not limited to those shown in FIG. 3. The positions where the power supply lines VSL1 and VDL1 and the output lines QL1 and QL2 are provided are not limited to those shown in FIG. 3. For example, the power supply lines VSL1 and VDL1 and the output lines QL1 and QL2 may be provided in a region outside the transistors TP1, TN1, TP2, and TN2.

The power supply voltage VSS1 can be supplied from the power supply pad PVSS1 to the source of the transistor TN1 along a short path by providing the connection lines CL1 and CL2, the power supply line VSL1, and the output line QL1 as shown in FIG. 3. Moreover, the signal DN1 can be output from the drains of the transistors TP1 and TN1 to the output pad PDN1 along a short path. Therefore, since the parasitic resistances of the lines indicated by A1 and A2 in FIG. 2A can be reduced, a shoot-through current and overshoot noise can be minimized.

The power supply voltage VDD1 can be supplied from the power supply pad PVDD1 to the source of the transistor TP1 along a short path by providing the connection lines CL3 and CL4, the power supply line VDL1, and the output line QL2 as shown in FIG. 3. Moreover, the signal DP1 can be output from the drains of the transistors TP2 and TN2 to the output pad PDP1 along a short path. Therefore, since the parasitic resistances of the lines indicated by A3 and A4 in FIG. 2A can be reduced, a shoot-through current and overshoot noise can be minimized.

Specifically, in order to prevent a shoot-through current while minimizing overshoot noise in the external driver DR1 which operates at a high driving frequency, it is desirable to increase an ON transition period in which the transistors PTP1 and PTN1 transition from an OFF state to an ON state and reduce an OFF transition period in which the transistors PTP1 and PTN1 transition from an ON state to an OFF state, as described later.

Therefore, it is desirable to increase an H level transition period of the signal DN1 in which the transistor TP1 of the predriver PR1 shown in FIG. 2A is turned ON to change the signal DN1 from the L level to the H level, and reduce an L level transition period of the signal DN1 in which the transistor TN1 is turned ON to change the signal DN1 from the H level to the L level. Likewise, it is desirable to increase an L level transition period of the signal DP1 in which the transistor TN2 of the predriver PR2 is turned ON to change the signal DP1 from the H level to the L level, and reduce an H level transition period of the signal DP1 in which the transistor TP2 is turned ON to change the signal DP1 from the L level to the H level.

According to the arrangement configuration shown in FIG. 3, the parasitic resistance of the line indicated by A5 in FIG. 2A increases, and the parasitic resistances of the lines indicated by A1 and A2 decrease. Therefore, since the H level transition period of the signal DN1 increases and the L level transition period of the signal DN1 decreases, the ON transition period of the transistor PTN1 of the external driver DR1 can be increased and the OFF transition period of the transistor PTN1 can be reduced. As a result, overshoot noise can be reduced while reducing a shoot-through current.

According to the arrangement configuration shown in FIG. 3, the parasitic resistance of the line indicated by A6 in FIG. 2A increases, and the parasitic resistances of the lines indicated by A3 and A4 decrease. Therefore, since the L level transition period of the signal DP1 increases and the H level transition period of the signal DP1 decreases, the ON transition period of the transistor PTP1 of the external driver DR1 can be increased and the OFF transition period of the transistor PTP1 can be reduced. As a result, overshoot noise can be reduced while reducing a shoot-through current.

In FIG. 3, the low-potential-side power supply line VSL1 and the high-potential-side power supply line VDL1 of the predrivers PR1 and PR2 are separated from a low-potential-side power supply line and a high-potential-side power supply line of other circuits of the integrated circuit device, as indicated by B1 and B2. Specifically, the power supply lines are disconnected at points indicated by B1 and B2. This prevents a situation in which switching noise (power supply noise) generated by the predrivers PR1 and PR2 through which a large current flows in order to charge/discharge a large parasitic capacitor of the external driver DR1 adversely affects other circuits, or switching noise generated by other circuits adversely affects the operations of the predrivers PR1 and PR2.

In FIG. 3, an electrostatic discharge protection region ESDR1 in which a plurality of predriver electrostatic discharge protection elements are disposed is provided between a region which includes the power supply pad PVSS1, the output pads PDN1 and PDP1, and the power supply pad PVDD1 and a region which includes the predrivers PR1 and PR2. A diode, a thyristor, or the like may be used as the electrostatic discharge protection element, for example. The electrostatic discharge protection elements may be provided in pad units, for example.

An electrostatic discharge protection low-potential-side power supply line VSLES1 which is connected to the low-potential-side power supply pad PVSS1 and supplies the low-potential-side power supply VSS1 to the predriver electrostatic discharge protection element is provided in the electrostatic discharge protection region ESDR1 along the direction D1. An electrostatic discharge protection high-potential-side power supply line VDLES1 which is connected to the high-potential-side power supply pad PVDD1 and supplies the high-potential-side power supply VDD1 to the predriver electrostatic discharge protection element is provided in the electrostatic discharge protection region ESDR1 along the direction D1.

As indicated by B3 and B4 in FIG. 3, the electrostatic discharge protection low-potential-side power supply line VSLES1 and the electrostatic discharge protection high-potential-side power supply line VDLES1 are separated from an electrostatic discharge protection low-potential-side power supply line and an electrostatic discharge protection high-potential-side power supply line of other circuits. Specifically, the power supply lines are disconnected at points indicated by B3 and B4.

This prevents a situation in which switching noise generated by the predrivers PR1 and PR2 is transmitted through the power supply lines VSLES1 and VDLES1 and adversely affects other circuits, or switching noise generated by other circuits adversely affects the operations of the predrivers PR1 and PR2.

2. Gate Control Circuit

Figure 4:
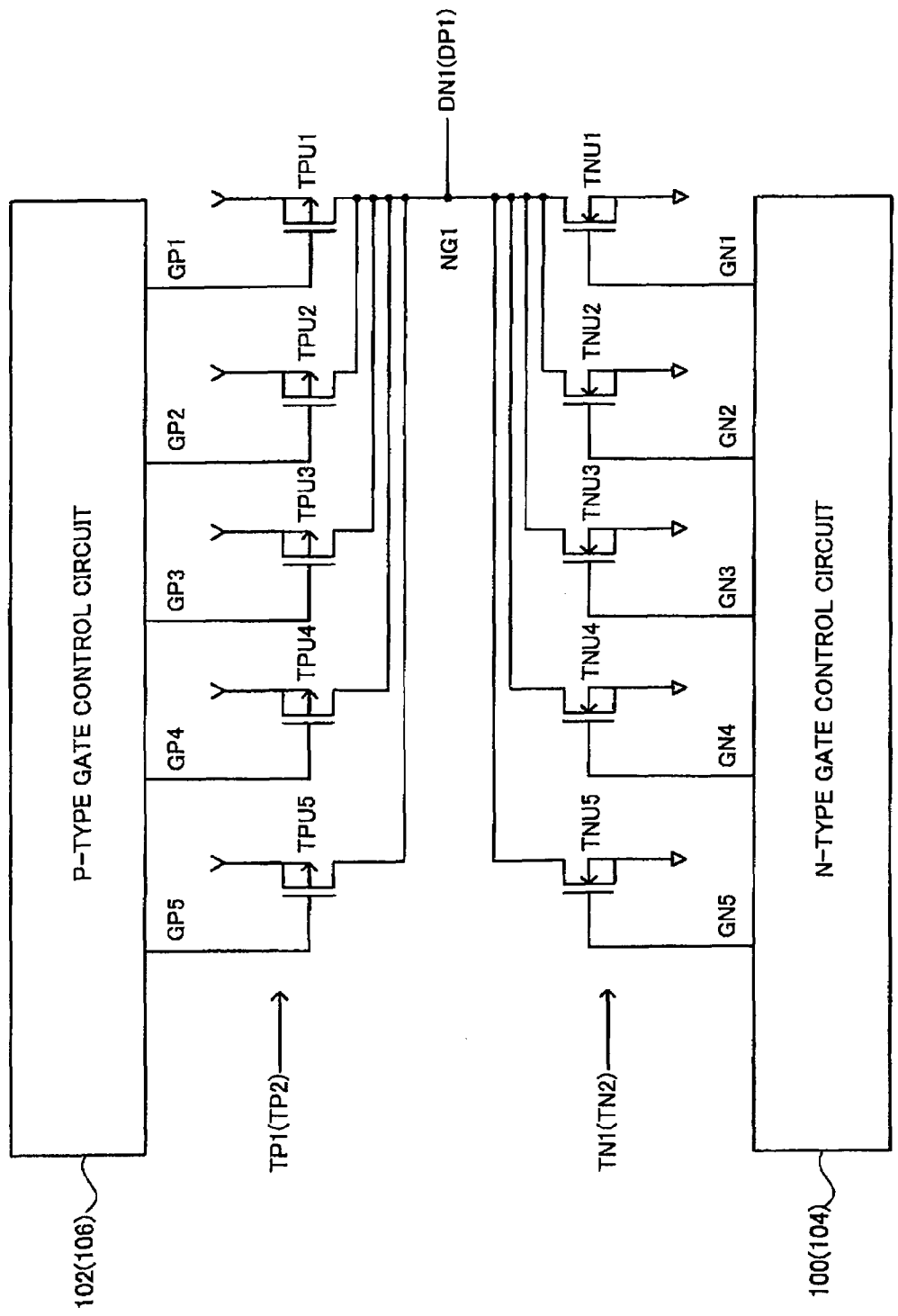
FIG. 4 is a view illustrative of a gate control circuit.

The N-type transistor TN1 shown in FIG. 3 may include a plurality of unit transistors TNU1 to TNU5 connected in parallel as shown in FIG. 4, and the P-type transistor TP1 may include a plurality of unit transistors TPU1 to TPU5 connected in parallel. This also applies to the N-type transistor TN2 and the P-type transistor TP2.

As shown in FIG. 2B, the unit transistors TNU1 to TNU5 and TPU1 to TPU5 are transistors of which the gate direction coincides with the direction D2. The power supply voltage VSS1 is supplied to the sources of the unit transistors TNU1 to TNU5, and the power supply voltage VDD1 is supplied to the sources of the unit transistors TPU1 to TPU5. The drains of the unit transistors TNU1 to TNU5 and the drains of the unit transistor TPU1 to TPU5 are connected to an output node NG1 of the signal DN1.

An N-type gate control circuit 100 generates and outputs gate control signals GN1 to GN5. Specifically, the N-type gate control circuit 100 outputs the gate control signals GN1 to GN5 respectively input to the gates of the unit transistors TNU1 to TNU5 of the N-type transistor TN1.

When the N-type gate control circuit 100 causes the N-type transistor TN1 to be turned ON, the N-type gate control circuit 100 outputs the gate control signals GN1 to GN5 which respectively cause the unit transistors TNU1 to TNU5 of the N-type transistor TN1 to be turned ON at different timings. For example, the N-type gate control circuit 100 successively changes the gate control signals GN5, GN4, GN3, GN2, and GN1 from the L level to the H level so that the unit transistors TNU5, TNU4, TNU3, TNU2, and TNU1 are successively turned ON.

When the N-type gate control circuit 100 causes the N-type transistor TN1 to be turned OFF, the N-type gate control circuit 100 outputs the gate control signals GN1 to GN5 which respectively cause the unit transistors TNU1 to TNU5 of the N-type transistor TN1 to be turned OFF at the same timing (including almost the same timing). Specifically, the N-type gate control circuit 100 changes the gate control signal GN1 to GN5 from the H level to the L level at the same timing so that the unit transistors TNU1 to TNU5 are turned OFF at the same timing.

A P-type gate control circuit 102 generates and outputs gate control signals GP1 to GP5. Specifically, the P-type gate control circuit 102 outputs the gate control signals GP1 to GP5 respectively input to the gates of the unit transistors TPU1 to TPU5 of the P-type transistor TP1.

When the P-type gate control circuit 102 causes the P-type transistor TP1 to be turned ON, the P-type gate control circuit 102 outputs the gate control signals GP1 to GP5 which respectively cause the unit transistors TPU1 to TPU5 of the P-type transistor TP1 to be turned ON at different timings. For example, the P-type gate control circuit 102 successively changes the gate control signals GP5, GP4, GP3, GP2, and GP1 from the H level to the L level so that the unit transistors TPU5, TPU4, TPU3, TPU2, and TPU1 are successively turned ON.

When the P-type gate control circuit 102 causes the P-type transistor TP1 to be turned OFF, the P-type gate control circuit 102 outputs the gate control signals GP1 to GP5 which respectively cause the unit transistors TPU1 to TPU5 of the P-type transistor TP1 to be turned OFF at the same timing (including almost the same timing). Specifically, the P-type gate control circuit 102 changes the gate control signal GP1 to GP5 from the L level to the H level at the same timing so that the unit transistors TPU1 to TPU5 are turned OFF at the same timing.

Figure 6:
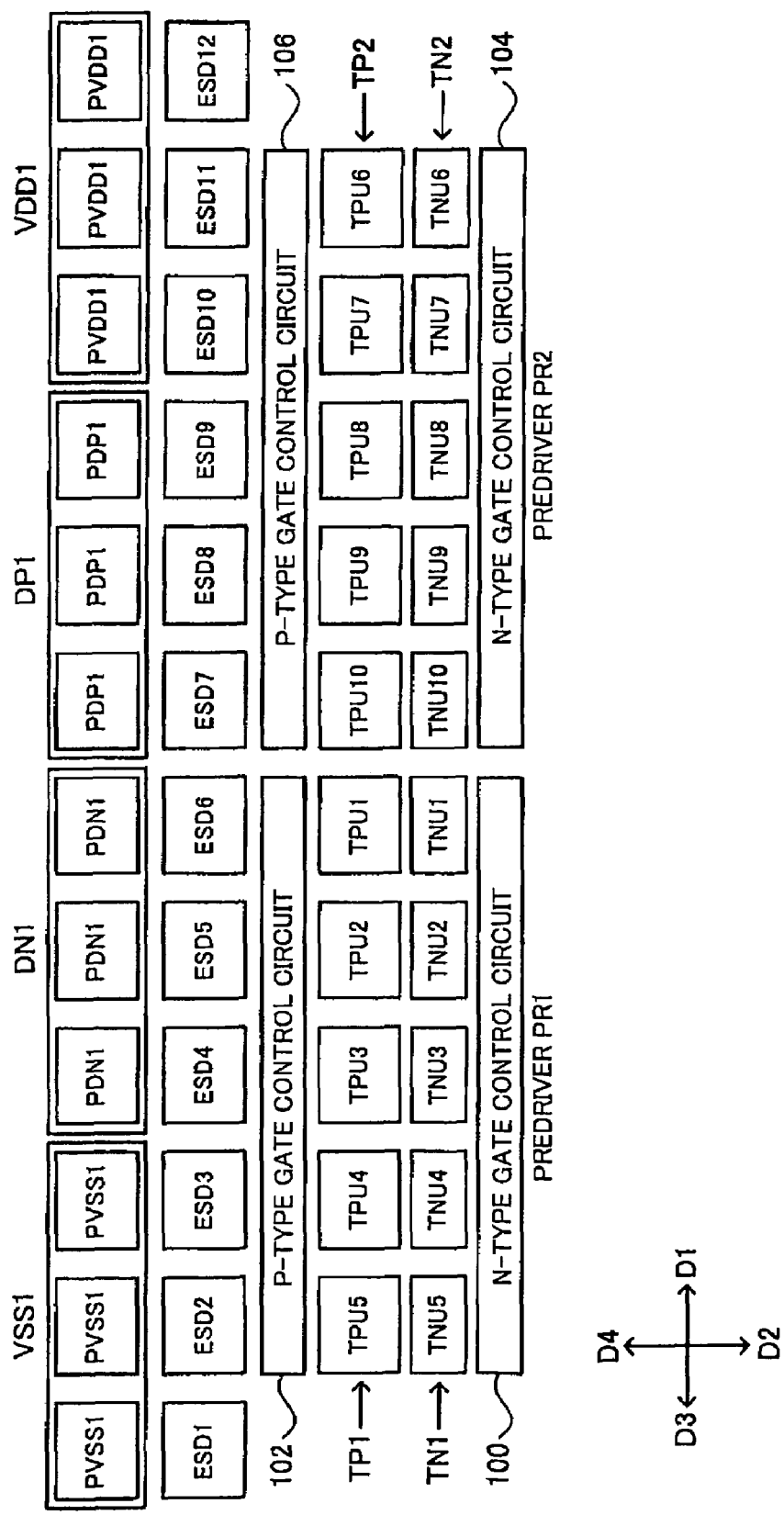
FIG. 6 shows a detailed layout example of a predriver.

As shown in FIG. 6 described later, the N-type transistor TN2 and the P-type transistor TP2 respectively include unit transistors TNU6 to TNU10 and TPU6 to TPU10 connected in parallel in the same manner as in FIG. 4. The integrated circuit device includes a second N-type gate control circuit 104 which outputs a plurality of gate control signals to the unit transistors TNU6 to TNU10 of the N-type transistor TN2 and a second P-type gate control circuit 106 which outputs a plurality of gate control signals to the unit transistors TPU6 to TPU10 of the P-type transistor TP2. The second N-type gate control circuit 104 and the second P-type gate control circuit 106 are configured and operate in the same manner as the first N-type gate control circuit 100 and the first P-type gate control circuit 102 shown in FIG. 4.

Figure 5:
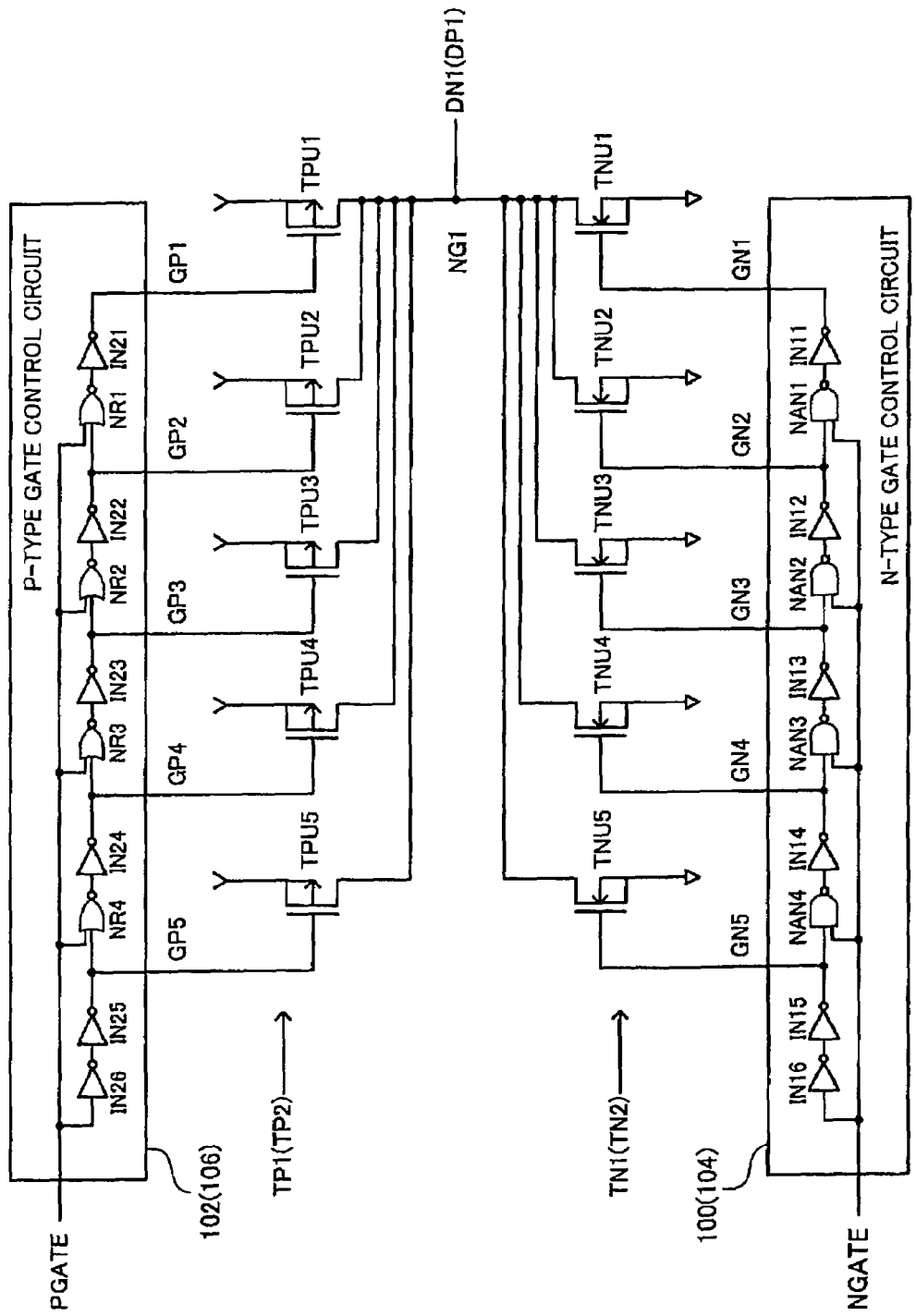
FIG. 5 shows a detailed configuration example of a gate control circuit.

FIG. 5 shows a detailed configuration example of the gate control circuits 100 and 102 (104 and 106). The N-type gate control circuit 100 includes NAND circuits NAN1 to NAN4 and inverter circuits IN11 to IN16. A signal NGATE which ON/OFF-controls the N-type unit transistors TNU1 to TNU5 is input to first input terminals of the NAND circuits NAN1 to NAN4 and the inverter circuit IN16. Outputs from the inverter circuits IN12 to IN15 in the preceding stage are respectively input to second input terminals of the NAND circuits NAN1 to NAN4. Outputs from the NAND circuits NAN1 to NAN4 are respectively input to the inverter circuits IN11 to IN14, and an output from the inverter circuit IN16 is input to the inverter circuit IN15. Outputs from the inverter circuits IN11 to IN15 are respectively used as the gate control signals GN1 to GN5.

The P-type gate control circuit 102 includes NOR circuits NR1 to NR4 and inverter circuits IN21 to IN26. A signal PGATE which ON/OFF-controls the P-type unit transistors TPU1 to TPU5 is input to first input terminals of the NOR circuits NR1 to NR4 and the inverter circuit IN26. Outputs from the inverter circuits IN22 to IN25 in the preceding stage are respectively input to second input terminals of the NOR circuits NR1 to NR4. Outputs from the NOR circuits NR1 to NR4 are respectively input to the inverter circuits IN21 to IN24, and an output from the inverter circuit IN26 is input to the inverter circuit IN25. Outputs from the inverter circuits IN21 to IN25 are respectively used as the gate control signals GP1 to GP5.

The configuration of the gate control circuit is not limited to the configuration shown in FIG. 5. Various modifications may be made such as omitting some elements or adding other elements. For example, a plurality of stages (e.g., two stages) of inverter circuits which increase the element delay time may be further provided in the subsequent stage of the inverter circuits IN11 to IN15 and IN21 to IN25.

In FIG. 5, when the signal NGATE has changed from the L level to the H level, the signal GN5 changes from the L level to the H level after the element delay time due to the inverter circuits IN16 and IN15 has expired. As a result since the first and second input terminals of the NAND circuit NAN4 are set at the H level, the signal GN4 changes from the L level to the H level after the element delay time due to the NAND circuit NAN4 and the inverter circuit IN14 has expired. As a result, since the first and second input terminals of the NAND circuit NAN3 are set at the H level, the signal GN3 changes from the L level to the H level after the element delay time due to the NAND circuit NAN3 and the inverter circuit IN13 has expired. In FIG. 5, when the signal NGATE has changed from the L level to the H level, the gate control signals GN5, GN4, GN3, GN2, and GN1 successively change from the L level to the H level in this manner. Therefore, the unit transistors TNU5, TNU4, TNU3, TNU2, and TNU1 are successively turned ON.

On the other hand, when the signal NGATE has changed from the H level to the L level, the signals GN1 to GN5 change from the H level to the L level at the same timing (including almost the same timing). Therefore, the unit transistors TNU1 to TNU5 are turned OFF at the same timing. Specifically, when the signal NGATE has changed from the H level to the L level, the unit transistors TNU1 to TNU5 are turned OFF immediately after the element delay time has expired.

In FIG. 5, when the signal PGATE has changed from the H level to the L level, the signal GP5 changes from the H level to the L level after the element delay time due to the inverter circuits IN26 and IN25 has expired. As a result, since the first and second input terminals of the NOR circuit NR4 are set at the L level, the signal GP4 changes from the H level to the L level after the element delay time due to the NOR circuit NR4 and the inverter circuit IN24 has expired. As a result, since the first and second input terminals of the NOR circuit NR3 are set at the L level, the signal GP3 changes from the H level to the L level after the element delay time due to the NOR circuit NR3 and the inverter circuit IN23 has expired. In FIG. 5, when the signal PGATE has changed from the H level to the L level, the gate control signals GP5, GP4, GP3, GP2, and GP1 successively change from the H level to the L level in this manner. Therefore, the unit transistors TPU5, TPU4, TPU3, TPU2, and TPU1 are successively turned ON.

On the other hand, when the signal PGATE has changed from the L level to the H level, the signals GP1 to GP5 change from the L level to the H level at the same timing (including almost the same timing). Therefore, the unit transistors TPU1 to TPU5 are turned OFF at the same timing. Specifically, when the signal PGATE has changed from the L level to the H level, the unit transistors TPU1 to TPU5 are turned OFF immediately after the element delay time has expired.

In FIG. 5, when the transistors TP1 and TN1 are turned ON, the unit transistors TPU1 to TPU5 and TNU1 to TNU5 are turned ON at different timings. This reduces overshoot noise (switching noise) which occurs when the transistors TP1 and TN1 are turned ON.

In FIG. 5, when the transistors TP1 and TN1 are turned OFF, the unit transistors TPU1 to TPU5 and TNU1 to TNU5 are turned OFF at the same timing. This ensures that the ON period of the unit transistors TPU1 to TPU5 and the ON period of the unit transistors TPU1 to TPU5 do not overlap, whereby occurrence of a shoot-through current can be prevented.

When the unit transistors are turned ON at different timings, it takes time until all the unit transistors are turned ON. Therefore, a margin of time decreases when the driving frequency increases. On the other hand, a margin of time can be increased when the driving frequency increases by causing the unit transistors to be turned OFF at the same timing while causing the unit transistors to be turned ON at different timings.

FIG. 6 shows a detailed layout example of the predrivers PR1 and PR2. In FIG. 6, the first N-type gate control circuit 100 is disposed in the direction D2 with respect to the unit transistors TNU1 to TNU5 of the first N-type transistor TN1 and the unit transistors TPU1 to TPU5 of the first P-type transistor TP1, and the first P-type gate control circuit 102 is disposed in the direction D4 with respect to the unit transistors TNU1 to TNU5 of the first N-type transistor TN1 and the unit transistors TPU1 to TPU5 of the first P-type transistor TP1. FIG. 6 shows an example in which the transistors TP1 (TPU1 to TPU5) and TN1 (TNU1 to TNU5) are disposed in that order along the direction D2. Note that the transistors TN1 and TP1 may be disposed in that order along the direction D2. In this case, the first P-type gate control circuit 102 is disposed in the direction D2 with respect to the transistors TN1 and TP1, and the first N-type gate control circuit 100 is disposed in the direction D4 with respect to the transistors TN1 and TP1.

In FIG. 6, the second N-type gate control circuit 104 is disposed in the direction D2 with respect to the unit transistors TNU6 to TNU10 of the second N-type transistor TN2 and the unit transistors TPU6 to TPU10 of the second P-type transistor TP2, and the second P-type gate control circuit 106 is disposed in the direction D4 with respect to the unit transistors TNU6 to TNU10 of the second N-type transistor TN2 and the unit transistors TPU6 to TPU10 of the second P-type transistor TP2.

According to the arrangement shown in FIG. 6, gate control signal lines from the gate control circuits 100, 102, 104, and 106 can be connected to the unit transistors TNU1 to TNU5, TPU1 to TPU5, TNU6 to TNU10, and TPU6 to TPU10 along short paths. Therefore, the wiring region between the gate control circuit and the unit transistors can be minimized, whereby the layout area can be reduced. Moreover, since the parasitic resistance and the parasitic capacitance of the gate control signal line can be minimized, ON/OFF control of the transistors described with reference to FIGS. 4 and 5 can be optimized.

In FIG. 6, a plurality of (three) pads electrically connected through an aluminum layer or the like are respectively used as the pads PVSS1, PDN1, PDP1, and PVDD1. The arrangement pitch of the pads in the direction D1 is set to be the same (including almost the same) as the arrangement pitch of the unit transistors in the direction D1. The arrangement pitch of the electrostatic discharge protection elements (ESD1 to ESD12) is also set to be the same as the arrangement pitch of the unit transistors.

This makes it possible to set the number of unit transistors which drive each power MOS transistor of the external driver at a number corresponding to the size of the power MOS transistor by simply changing the layout. For example, the number of unit transistors arranged in the direction D1 may be decreased when driving a power MOS transistor (external device in a broad sense) with a small size, and the number of unit transistors arranged in the direction D1 may be increased when driving a power MOS transistor with a large size. In FIG. 6, since the arrangement pitch of the pads is the same as the arrangement pitch of the unit transistors, power MOS transistors with various sizes can be driven by merely increasing or decreasing the number of units, each of which includes the pad and the unit transistor (and the electrostatic discharge protection element), arranged in the direction D1. Therefore, an increase in efficiency of the layout design and a reduction in design period can be achieved.

3. Arrangement of Predriver

Figure 7:
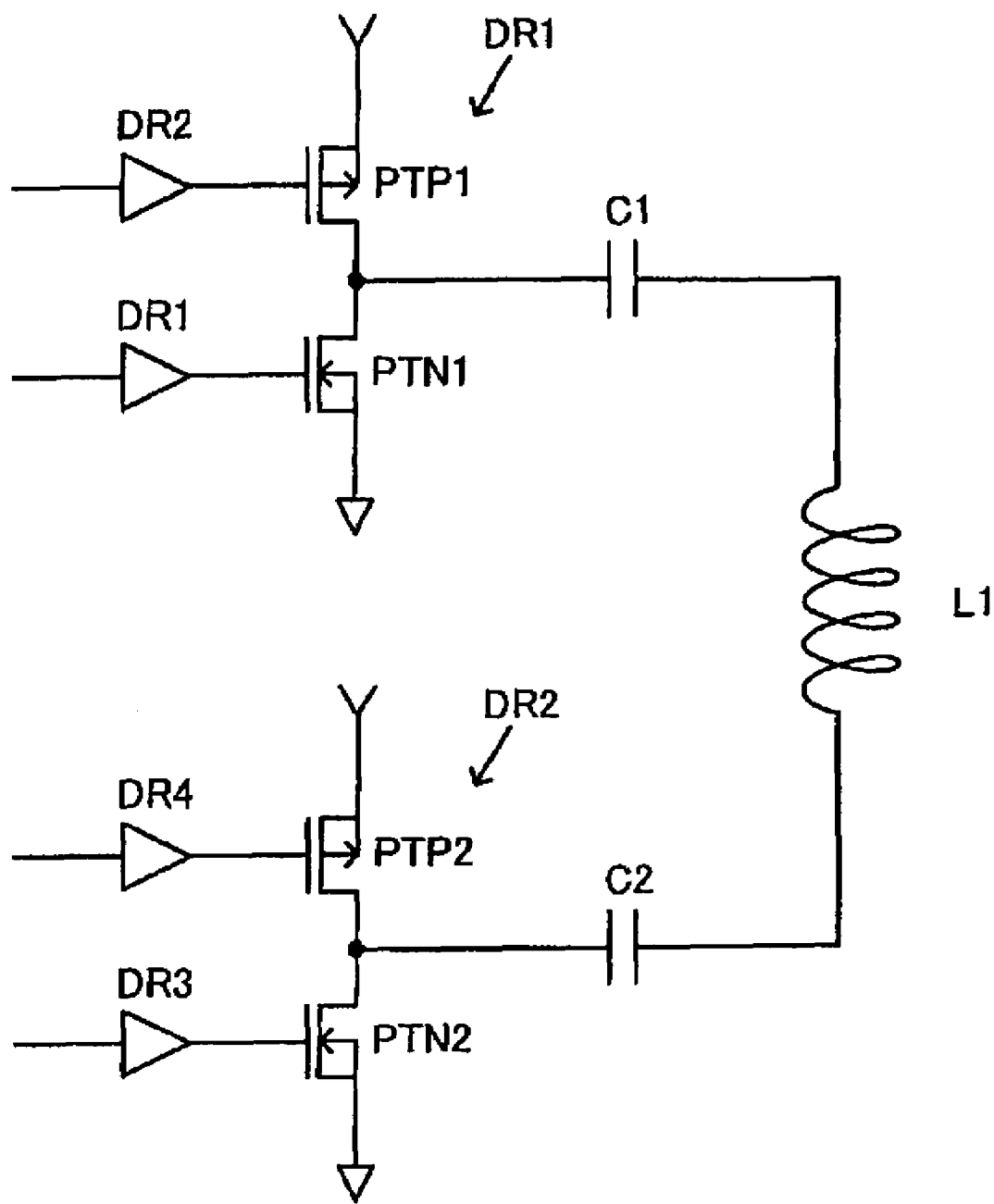
FIG. 7 is a view illustrative of a power transmission driver (external driver) and a resonant circuit.

In a non-contact power transmission system described later, a resonant circuit (series resonant circuit) is formed using a primary coil L1 and capacitors C1 and C2, as shown in FIG. 7. This makes it necessary to provide the external driver DR1 (first power transmission driver) which drives one end of the primary coil L1 and the external driver DR2 (second power transmission driver) which drives the other end of the primary coil L1. Specifically, the capacitor C1 is provided between the output of the external driver DR1 and one end of the primary coil L1, and the capacitor C2 is provided between the output of the external driver DR2 and the other end of the primary coil L1. Note that the configuration of the resonant circuit is not limited to the configuration shown in FIG. 7. For example, one of the capacitors C1 and C2 may be omitted.

In FIG. 7, the external driver DR1 includes the first N-type power MOS transistor PTN1 and the first P-type power MOS transistor PTP1. As described with reference to FIG. 1 and the like, the predriver PR1 drives the transistor PTN1 of the external driver DR1, and the predriver PR2 drives the transistor PTP1. The external driver DR2 includes the second N-type power MOS transistor PTN2 and the second P-type power MOS transistor PTP2. The predriver PR3 drives the transistor PTN2 of the external driver DR2, and the predriver PR4 drives the transistor PTP2.

Figure 8:
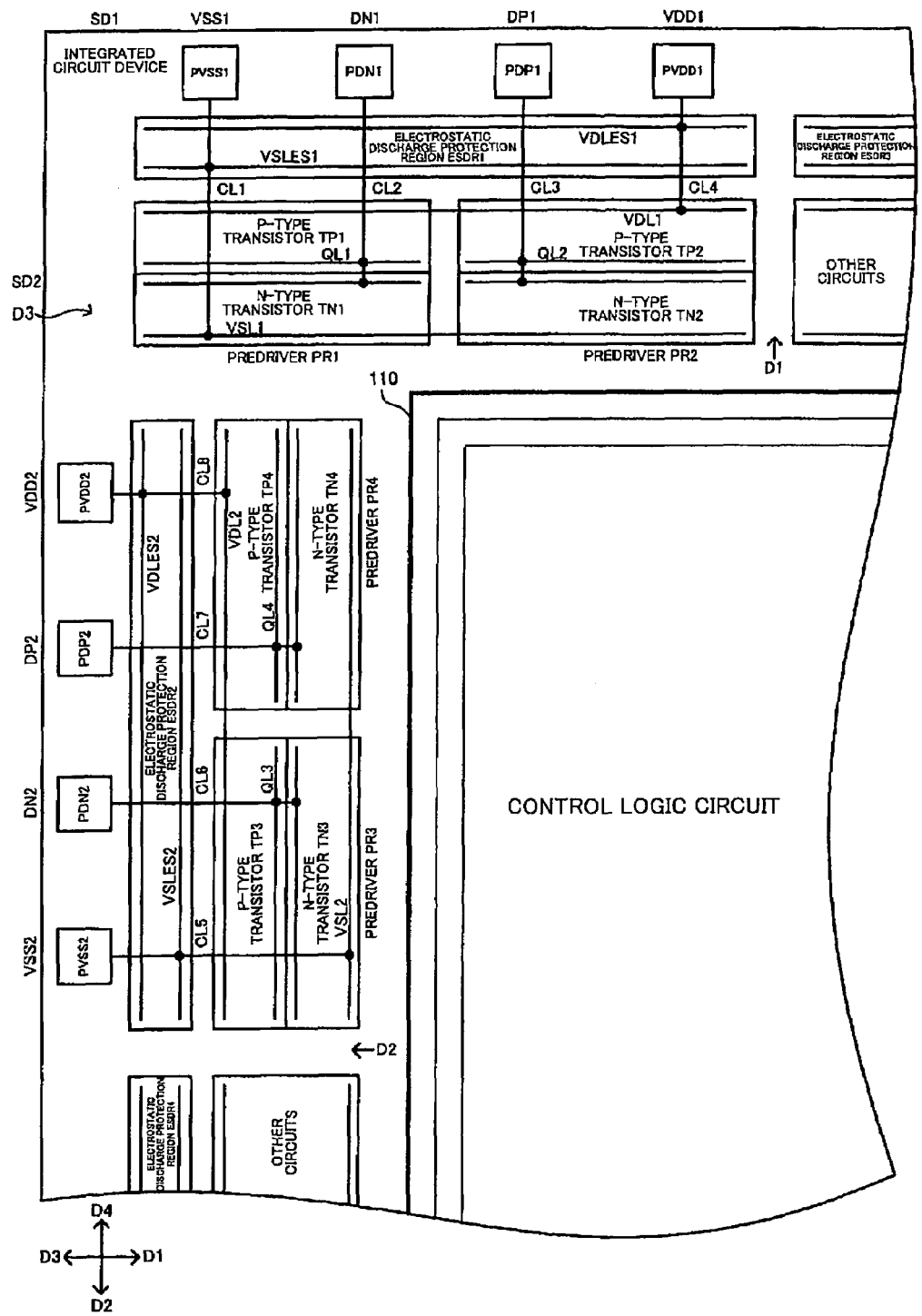
FIG. 8 shows a detailed arrangement configuration example of a predriver.

FIG. 8 shows an arrangement configuration example of the integrated circuit device according to this embodiment in which the predrivers PR1 to PR4 are disposed. In FIG. 8, the predrivers PR1 and PR2 are disposed along the first side SD1 of the integrated circuit device. The predrivers PR3 and PR4 are disposed along the second side SD2 of the integrated circuit device. The side SD2 is a side which perpendicularly intersects the side SD1. Specifically, the side SD1 is a side along the direction D1, and the side SD2 is a side along the direction D2. The corner of the integrated circuit device is formed by the sides SD1 and SD2. The predrivers PR1 to PR4 are disposed in the corner area of the integrated circuit device.

According to the arrangement shown in FIG. 8, the predrivers PR1, PR2, PR3, and PR4 can be easily separated from other circuits with regard to power supply. Specifically, a layout taking power supply separation into consideration is necessary only in areas indicated by D1 and D2 in FIG. 8, and power supply separation need not be taken into consideration in a corner area indicated by D3. Therefore, layout efficiency can be increased. For example, when the power supply is separated in the area indicated by D1, if other circuits are disposed in the area indicated by D3, power supply lines must be provided to these other circuits disposed in the area indicated by D3, whereby layout efficiency deteriorates. Moreover, noise generated by the predriver may adversely affect these other circuits.

In FIG. 8, the predrivers PR1 and PR2 are disposed along the side SD1 in the corner area indicated by D3, and the predrivers PR3 and PR4 are disposed along the side SD2 in the corner area indicated by D3. Therefore, layout efficiency relating to the power supply lines and the like can be increased, whereby the chip area can be reduced. Moreover, an adverse effect of noise on other circuits can be minimized by collectively disposing the predrivers PR1 to PR4 in the corner area.

In FIG. 8, the control logic circuit 110 which controls the predrivers PR1 to PR4 is disposed in the direction D2 with respect to the predrivers PR1 and PR2 and in the direction D1 with respect to the predrivers PR3 and PR4. The control logic circuit 110 generates the signals NGATE and PGATE shown in FIG. 5 and the like to control the predrivers PR1 to PR4.

This arrangement enables signal lines to be provided between the control logic circuit 110 and the predrivers PR1 to PR4 along short paths, whereby layout efficiency can be increased. Moreover, since the predrivers PR1 to PR4 and the control logic circuit 110 which produce switching noise can be concentrated at a location apart from other circuits, an adverse effect of noise can be minimized. In FIG. 8, the power supply lines of the predrivers PR1 to PR4 are also electrically separated from the power supply lines of the control logic circuit so that a situation in which the predrivers PR1 to PR4 and the control logic circuit 110 are adversely affected by noise generated by the predrivers PR1 to PR4 or the control logic circuit 110 is prevented.

4. Modification

The above description illustrates an example in which the integrated circuit device drives the external driver (power transmission driver) used in a non-contact power transmission system or the like. Note that the driving target according to this embodiment is not limited thereto. The driving target may be a driver used for a system other than the non-contact power transmission system, or may be another external device, for example.

Figure 9:
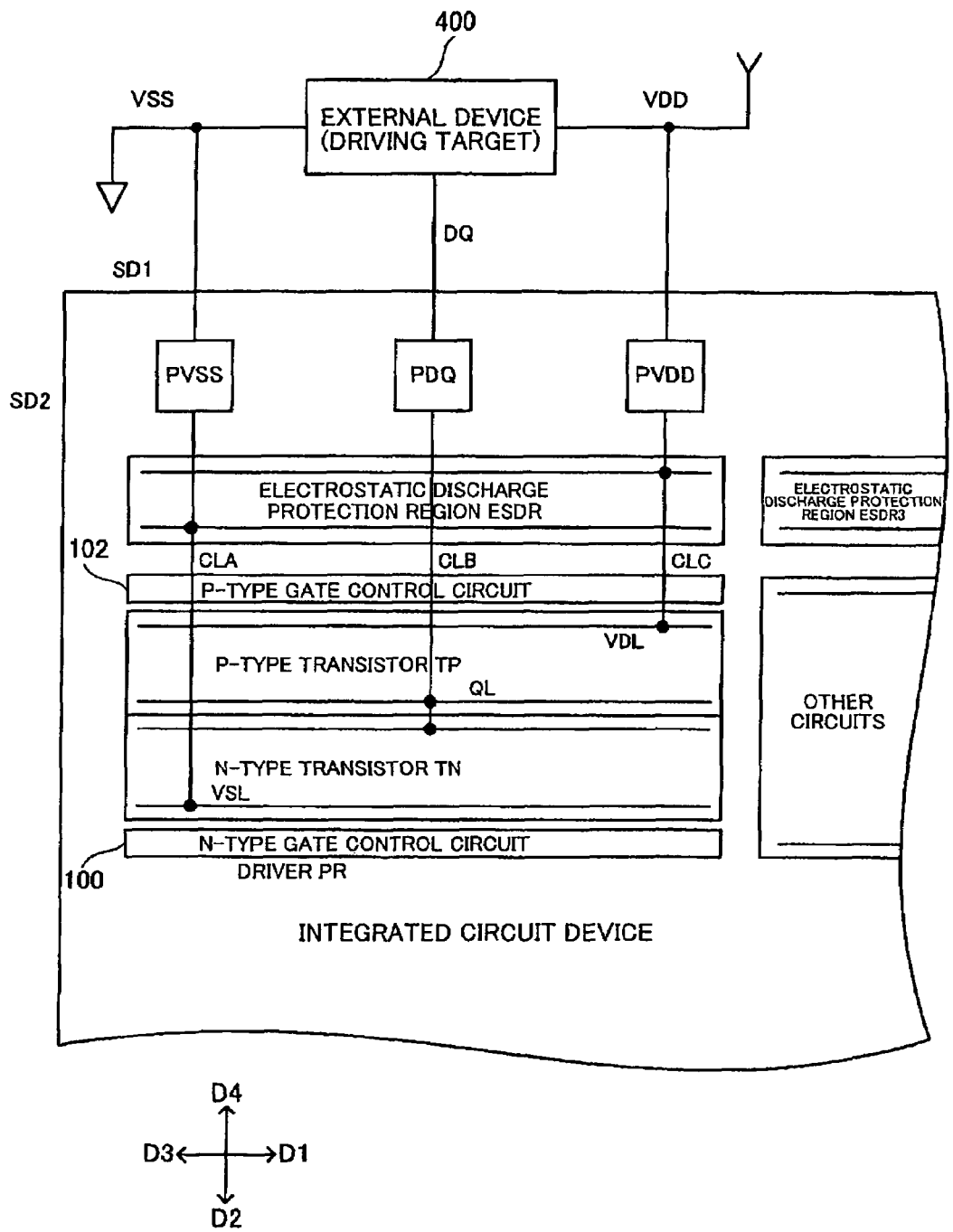
FIG. 9 shows an arrangement configuration example of an integrated circuit device according to a modification.

For example, an integrated circuit device shown in FIG. 9 includes a driver PR, a low-potential-side power supply pad PVSS, an output pad PDQ, and a high-potential-side power supply pad PVDD. The driver PR drives an external device 400 (driving target). The driver PR may have a configuration similar to that of the predriver described relating to this embodiment.

The output pad PDQ is a pad used to output an output signal DQ from the driver PR. The output signal DQ is input to the external device 400, whereby the external device 400 is driven. For example, when the external device 400 is a power MOS transistor, the output signal DQ is input to the gate of the power MOS transistor.

The power supply pad PVSS is a pad which supplies the low-potential-side power supply voltage VSS to the driver PR. The power supply pad PVDD is a pad which supplies the high-potential-side power supply voltage VDD to the driver PR. In FIG. 9, the power supply voltages VSS and VDD are also supplied to the external device 400.

In FIG. 9, the power supply pad PVSS, the output pad PDQ, and the power supply pad PVDD are disposed along the direction D1. For example, the output pad PDQ is disposed in the direction D1 with respect to the power supply pad PVSS, and the power supply pad PVDD is disposed in the direction D1 with respect to the output pad PDQ.

The driver PR is disposed in the direction D2 with respect to the power supply pad PVSS, the output pad PDQ, and the power supply pad PVDD. In the arrangement region of the driver PR, a P-type transistor TP and an N-type transistor TN which form the driver PR are disposed along the direction D2. Specifically, the transistors TP and TN are adjacently disposed along the direction D2. Note that the transistors TN and TP may disposed along the direction D2 in that order.

The N-type transistor TN includes a plurality of unit transistors connected in parallel in the same manner as in FIGS. 4 to 6. The P-type transistor TN also includes a plurality of unit transistors connected in parallel.

The N-type gate control circuit 100 outputs a plurality of gate control signals respectively input to the gates of the unit transistors of the N-type transistor TN in the same manner as in FIGS. 4 and 5. The P-type gate control circuit 102 outputs a plurality of gate control signals respectively input to the gates of the unit transistors of the P-type transistor TP. Specifically, the N-type gate control circuit 100 outputs gate control signals which cause the unit transistors of the N-type transistor TN to be turned ON at different timings when causing the N-type transistor TN to be turned ON and cause the unit transistors of the N-type transistor TN to be turned OFF at the same timing when causing the N-type transistor TN to be turned OFF. The P-type gate control circuit 100 outputs gate control signals which cause the unit transistors of the P-type transistor TP to be turned ON at different timings when causing the P-type transistor TP to be turned ON and cause the unit transistors of the P-type transistor TP to be turned OFF at the same timing when causing the P-type transistor TP to be turned OFF.

The N-type gate control circuit 100 (or P-type gate control circuit) is disposed in the direction D2 with respect to the unit transistors of the N-type transistor TN and the P-type transistor TP, and the P-type gate control circuit 102 (or N-type gate control circuit) is disposed in the direction D4 with respect to the unit transistors of the N-type transistor TN and the P-type transistor TP.

A power supply line VSL which supplies the power supply voltage VSS is provided along the direction D1 in the arrangement region of the driver PR. A first connection line CLA which connects the power supply pad PVSS and the power supply line VSL is provided along the direction D2 from the power supply pad PVSS to a low-potential-side power supply connection node of the driver PR. An output line QL connected to the output of the driver PR is provided along the direction D1 in the arrangement region of the driver PR. A second connection line CLB which connects the output pad PDQ and the output line QL is provided along the direction D2 from the output pad PDQ to an output connection node of the driver PR. A power supply line VDL which supplies the power supply voltage VDD to the driver PR is provided along the direction D1 in the arrangement region of the driver PR. A third connection line CLC which connects the power supply pad PVDD and the power supply line VDL is provided along the direction D2 from the power supply pad PVDD to a high-potential-side power supply connection node of the driver PR.

According to the modification shown in FIG. 9, the external device 400 such as a power MOS transistor can be efficiently driven using the driver PR having a small layout area. Moreover, a shoot-through current and overshoot noise can be minimized.

5. Electronic Instrument

Figure 10A:
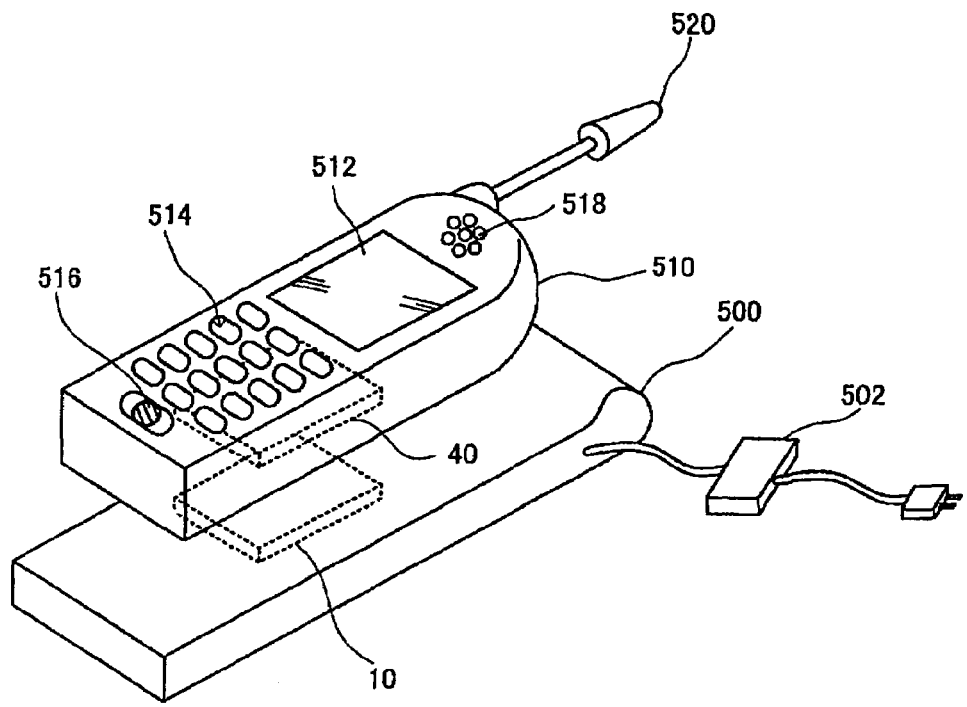
FIGS. 10A and 10B are views illustrative of non-contact power transmission.

FIG. 10A shows an example of electronic instruments in which the integrated circuit device according to this embodiment is used. These electronic instruments can perform non-contact power transmission.

A charger 500 (cradle) (i.e., electronic instrument) includes a power transmission device 10. A portable telephone 510 (i.e., electronic instrument) includes a power reception device 40. The portable telephone 510 includes a display section 512 such as an LCD, an operation section 514 which includes a button and the like, a microphone 516 (sound input section), a speaker 518 (sound output section), and an antenna 520.

Power is supplied to the charger 500 through an AC adaptor 502. The power supplied to the charger 500 is transmitted from the power transmission device 10 to the power reception device 40 by means of non-contact power transmission. This makes it possible to charge a battery of the portable telephone 510 or operate a device provided in the portable telephone 510.

The electronic instrument to which this embodiment is applied is not limited to the portable telephone 510. For example, this embodiment may be applied to various electronic instruments such as a wristwatch, a cordless telephone, a shaver, an electric toothbrush, a wrist computer, a handy terminal, a portable information terminal, and a power-assisted bicycle.

Figure 10B:
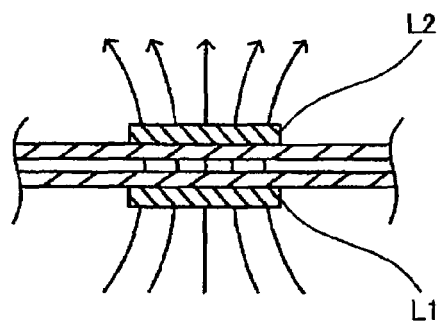

As schematically shown in FIG. 10B, power transmission from the power transmission device 10 to the power reception device 40 is implemented by electromagnetically coupling the primary coil L1 (transmitting coil) provided in the power transmission device 10 and a secondary coil L2 (receiving coil) provided in the power reception device 40 to form a power transmission transformer. This enables non-contact power transmission.

6. Power Transmission Device and Power Reception Device

Figure 11:
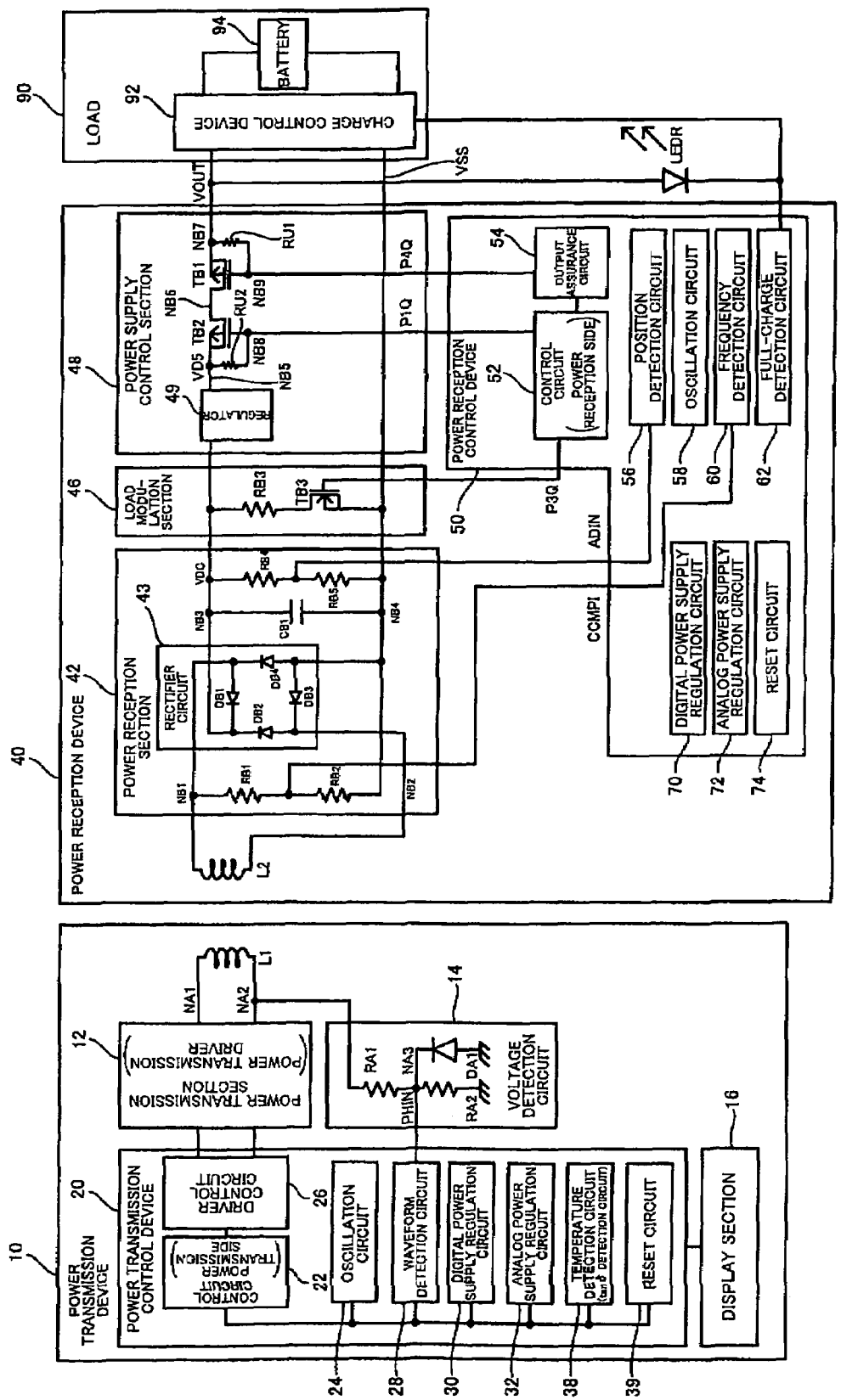
FIG. 11 shows a configuration example of a power transmission device, a power transmission control device, a power reception device, and a power reception control device.

FIG. 11 shows a configuration example of the power transmission device 10 and the power reception device 40. A power transmission-side electronic instrument such as the charger 500 shown in FIG. 10A includes at least the power transmission device 10 shown in FIG. 11. A power reception-side electronic instrument such as the portable telephone 510 includes at least the power reception device 40 and a load 90 (actual load). The configuration shown in FIG. 11 implements a non-contact power transmission (contactless power transmission) system in which power is transmitted from the power transmission device 10 to the power reception device 40 by electromagnetically coupling the primary coil L1 and the secondary coil L2 and power (voltage VOUT) is supplied to the load 90 from a voltage output node NB7 of the power reception device 40.

The power transmission device 10 (power transmission module or primary module) may include the primary coil L1, a power transmission section 12, a voltage detection circuit 14, a display section 16, and a power transmission control device 20. The power transmission device 10 and the power transmission control device 20 are not limited to the configuration shown in FIG. 11. Various modifications may be made such as omitting some elements (e.g., display section and voltage detection circuit), adding other elements, or changing the connection relationship.

Figure 12A:
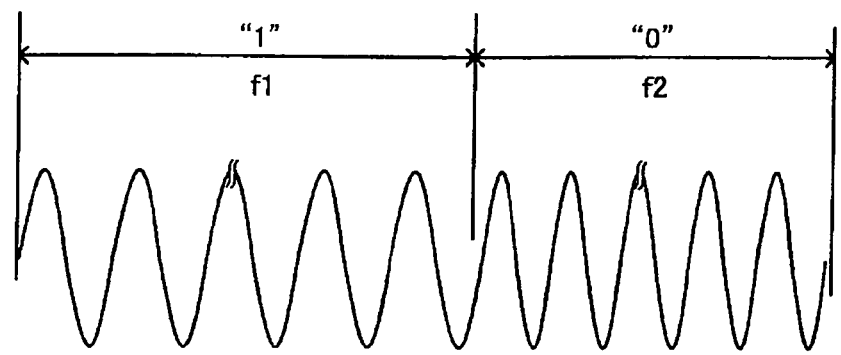
FIGS. 12A and 12B are views illustrative of data transfer by means of frequency modulation and load modulation.

The power transmission section 12 generates an alternating-current voltage at a given frequency during power transmission, and generates an alternating-current voltage at a frequency which differs depending on data during data transfer. The power transmission section 12 supplies the generated alternating-current voltage to the primary coil L1. As shown in FIG. 12A, the power transmission section 12 generates an alternating-current voltage at a frequency f1 when transmitting data "1" to the power reception device 40, and generates an alternating-current voltage at a frequency f2 when transmitting data "0" to the power reception device 40, for example.

The power transmission section 12 may include the first power transmission driver DR1 (first external driver) which drives one end of the primary coil L1, the second power transmission driver DR2 (second external driver) which drives the other end of the primary coil L1, the capacitor C1 and C2 which form resonant circuits together with the primary coil L1, as described with reference to FIG. 7. Each of the first and second power transmission drivers DR1 and DR2 included in the power transmission section 12 is an inverter circuit (buffer circuit) which includes a power MOS transistor, for example, and is controlled by a driver control circuit 26 of the power transmission control device 20.

The primary coil L1 (power transmission-side coil) is electromagnetically coupled with the secondary coil L2 (power reception-side coil) to form a power transmission transformer. For example, when power transmission is necessary, the portable telephone 510 is placed on the charger 500 so that a magnetic flux of the primary coil L1 passes through the secondary coil L2, as shown in FIGS. 10A and 10B. When power transmission is unnecessary, the charger 500 and the portable telephone 510 are physically separated so that a magnetic flux of the primary coil L1 does not pass through the secondary coil L2.

The voltage detection circuit 14 is a circuit which detects the induced voltage in the primary coil L1. The voltage detection circuit 14 includes resistors RA1 and RA2 and a diode DA1 provided between a connection node NA3 of the resistors RA1 and RA2 and GND (low-potential-side power supply in a broad sense), for example.

The voltage detection circuit 14 functions as a half-wave rectifier circuit for a coil end voltage signal of the primary coil L1. A signal PHIN (induced voltage signal or half-wave rectified signal) obtained by dividing the coil end voltage of the primary coil L1 using the resistors RA1 and RA2 is input to a waveform detection circuit 28 (amplitude detection circuit or pulse width detection circuit) of the power transmission control device 20. Specifically, the resistors RA1 and RA2 form a voltage divider circuit (resistor divider circuit), and the signal PHIN is output from the voltage division node NA3 of the resistors RA1 and RA2.

The display section 16 displays the state (e.g., power transmission or ID authentication) of the non-contact power transmission system using a color, an image, and the like. The display section 16 is implemented by an LED, an LCD, or the like.

The power transmission control device 20 is a device which controls the power transmission device 10. The power transmission control device 20 may be implemented by the integrated circuit device (IC) according to this embodiment, for example. The power transmission control device 20 may include a control circuit 22 (power transmission side), an oscillation circuit 24, a driver control circuit 26, a waveform detection circuit 28, a digital power supply regulation circuit 30, an analog power supply regulation circuit 32, a temperature detection circuit 38, and a reset circuit 39.

The control circuit 22 (control section) controls the power transmission device 10 and the power transmission control device 20. The control circuit 22 may be implemented by a gate array, a microcomputer, or the like. Specifically, the control circuit 22 performs sequence control and a determination process necessary for power transmission, load detection, frequency modulation, foreign object detection, detachment detection, and the like.

The oscillation circuit 24 includes a crystal oscillation circuit, for example. The oscillation circuit 24 generates a primary-side clock signal. The driver control circuit 26 generates a control signal at a desired frequency based on the clock signal generated by the oscillation circuit 24, a frequency setting signal from the control circuit 22, and the like, and outputs the generated control signal to the first and second power transmission drivers DR1 and DR2 of the power transmission section 12 to control the first and second power transmission drivers DR1 and DR2.

The waveform detection circuit 28 monitors the waveform of the signal PHIN which corresponds to the induced voltage at one end of the primary coil L1, and detects a change in load on the secondary side (power reception device). This enables data (load) detection, foreign object (metal) detection, detachment (removal) detection, and the like. Specifically, the waveform detection circuit 28 (amplitude detection circuit) detects amplitude information (peak voltage, amplitude voltage, and root-mean-square voltage) relating to the signal PHIN which corresponds to the induced voltage at one end of the primary coil L1.

Figure 12B:
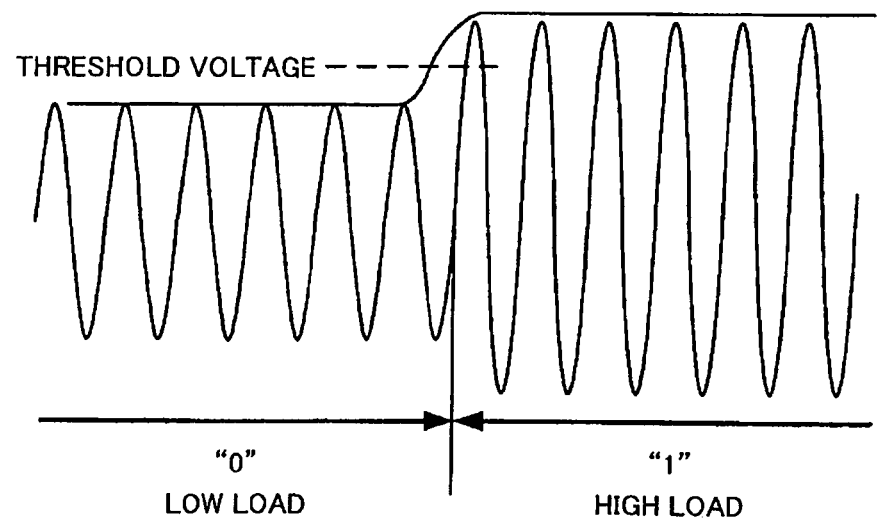

For example, when a load modulation section 46 of the power reception device 40 modulates load in order to transmit data to the power transmission device 10, the signal waveform of the induced voltage in the primary coil L1 changes as shown in FIG. 12B. Specifically, the amplitude (peak voltage) of the signal waveform decreases when the load modulation section 46 reduces load in order to transmit data "0", and the amplitude of the signal waveform increases when the load modulation section 46 increases load in order to transmit data "1". Therefore, the waveform detection circuit 28 can determine whether the data from the power reception device 40 is "0" or "1" by determining whether or not the peak voltage has exceeded a threshold voltage as a result of a peak-hold process on the signal waveform of the induced voltage, for example.

The load change detection method performed by the waveform detection circuit 28 is not limited to the method shown in FIGS. 12A and 12B. The waveform detection circuit 28 may determine whether the power reception-side load has increased or decreased using a physical quantity other than the peak voltage. For example, the waveform detection circuit 28 (pulse width detection circuit) may detect pulse width information (pulse width period in which the coil end voltage waveform is equal to or higher than given setting voltage) relating to the induced voltage signal PHIN of the primary coil L1. Specifically, the waveform detection circuit 28 receives a waveform adjusting (shaping) signal from a waveform adjusting circuit which generates a waveform adjusting signal for the signal PHIN and a drive clock signal from a drive clock signal generation circuit which supplies the drive clock signal to the driver control circuit 26. The waveform detection circuit 28 may detect the pulse width information relating to the induced voltage signal PHIN by detecting pulse width information relating to the waveform adjusting signal to detect a change in load.

The digital power supply regulation circuit 30 (digital power supply regulator or digital constant voltage generation circuit) regulates a digital power supply (digital power supply voltage or logic power supply voltage). Specifically, the digital power supply regulation circuit 30 regulates a 5 V digital power supply voltage input from the outside, and outputs a digital power supply voltage at a stable potential of 3 V, for example. The control circuit 22 (circuit including logic cell) operates based on the digital power supply voltage regulated by and supplied from the digital power supply regulation circuit 30.

The analog power supply regulation circuit 32 (analog power supply regulator or analog constant voltage generation circuit) regulates an analog power supply (analog power supply voltage). Specifically, the analog power supply regulation circuit 32 regulates a 5 V analog power supply voltage input from the outside, and outputs an analog power supply voltage at a stable potential of 4.5 V, for example. The analog circuit (circuit including comparator, operational amplifier, and the like) included in the power transmission control device 20 operates based on the analog power supply voltage regulated by and supplied from the analog power supply regulation circuit 32.

A series regulator may be employed as the digital power supply regulation circuit 30 and the analog power supply regulation circuit 32, for example. The series regulator may include a driver transistor which is provided between a high-potential-side power supply and an output node, a voltage divider circuit which is provided between the output node and a low-potential-side power supply and divides the output voltage using a resistor, an operational amplifier of which a first input terminal (e.g., non-inverting input terminal) is provided with a reference voltage, a second input terminal (e.g., inverting input terminal) is provided with the resistor-divided voltage from the voltage divider circuit, and an output terminal is connected to the gate of the driver transistor, and the like. The analog power supply regulation circuit 32 may be a circuit which generates an analog ground voltage GND and supplies the analog ground voltage GND to the analog circuit 120.

The temperature detection circuit 38 detects the temperature of the capacitors C1 and C2 shown in FIG. 7 to detect an abnormality (failure) in tan$\delta$ of the capacitors. The control circuit 22 suspends power transmission using the power transmission driver DR1 and DR2 of the power transmission section 12 when an abnormality in tan$\delta$ of the capacitor has been detected. Specifically, the temperature detection circuit 38 detects abnormality in tan$\delta$ of the capacitor by calculating the difference between the capacitor temperature and the ambient temperature. The control circuit 22 suspends power transmission from the primary side to the secondary side when the control circuit 22 has determined that the difference between the capacitor temperature and the ambient temperature has exceeded a given temperature difference. The control circuit 22 may suspend power transmission from the primary side to the secondary side when the control circuit 22 has determined that the capacitor temperature has exceeded a given temperature.

The reset circuit 39 generates a reset signal and outputs the generated reset signal to each circuit of the power transmission control device 20 (integrated circuit device). Specifically, the reset circuit 39 monitors the power supply voltage input from the outside, the digital power supply (logic power supply) voltage regulated by the digital power supply regulation circuit 30, and the analog power supply voltage regulated by the analog power supply regulation circuit 32. The reset circuit 39 cancels the reset signal when these power supply voltages have appropriately risen so that each circuit of the integrated circuit device starts an operation to implement a power-on reset.

The power reception device 40 (power reception module or secondary module) may include the secondary coil L2, a power reception section 42, the load modulation section 46, a power supply control section 48, and a power reception control device 50. The power reception device 40 and the power reception control device 50 are not limited to the configuration shown in FIG. 11. Various modifications may be made such as omitting, some elements, adding other elements, or changing the connection relationship.

The power reception section 42 converts an alternating-current induced voltage in the secondary coil L2 into a direct-current voltage. A rectifier circuit 43 included in the power reception section 42 converts the alternating-current induced voltage. The rectifier circuit 43 includes diodes DB1 to DB4. The diode DB1 is provided between a node NB1 at one end of the secondary coil L2 and a node NB3 (direct-current voltage VDC), the diode DB2 is provided between the node NB3 and a node NB2 at the other end of the secondary coil L2, the diode DB3 is provided between the node NB2 and a node NB4 (VSS), and the diode DB4 is provided between the nodes NB4 and NB1.

Resistors RB1 and RB2 of the power reception section 42 are provided between the nodes NB1 and NB4. A signal CCMPI obtained by dividing the voltage between the nodes NB1 and NB4 using the resistors RB1 and RB2 is input to a frequency detection circuit 60 of the power reception control device 50.

A capacitor CB1 and resistors RB4 and RB5 of the power reception section 42 are provided between the node NB3 (direct-current voltage VDC) and the node NB4 (VSS). A signal ADIN obtained by dividing the voltage between the nodes NB3 and NB4 using the resistors RB4 and RB5 is input to a position detection circuit 56 of the power reception control device 50.

The load modulation section 46 performs a load modulation process. Specifically, when the power reception device 40 transmits desired data to the power transmission device 10, the load modulation section 46 variably changes the load in the load modulation section 46 (secondary side) depending on transmission data to change the signal waveform of the induced voltage in the primary coil L1 as shown in FIG. 12B. The load modulation section 46 includes a resistor RB3 and a transistor TB3 (N-type CMOS transistor) provided in series between the nodes NB3 and NB4. The transistor TB3 is ON/OFF-controlled based on a signal P3Q from a control circuit 52 of the power reception control device 50. When performing the load modulation process by ON/OFF-controlling the transistor TB3, transistors TB1 and TB2 of the power supply control section 48 are turned OFF so that the load 90 is not electrically connected to the power reception device 40.

For example, when reducing the secondary-side load (high impedance) in order to transmit data "0", as shown in FIG. 12B, the signal P3Q is set at the L level so that the transistor TB3 is turned OFF. As a result, the load in the load modulation section 46 becomes almost infinite (no load). On the other hand, when increasing the secondary-side load (low impedance) in order to transmit data "1", the signal P3Q is set at the H level so that the transistor TB3 is turned ON. As a result, the load in the load modulation section 46 becomes the resistance RB3 (high load).

The power supply control section 48 controls power supply to the load 90. A regulator 49 regulates the voltage level of the direct-current voltage VDC obtained by conversion by the rectifier circuit 43 to generate a power supply voltage VD5 (e.g., 5 V). The power reception control device 50 operates based on the power supply voltage VD5 supplied from the power supply control section 48, for example.

A transistor TB2 (P-type CMOS transistor) is controlled based on a signal P1Q from the control circuit 52 of the power reception control device 50. Specifically, the transistor TB2 is turned ON when ID authentication has been completed (established) and normal power transmission is performed, and is turned OFF during load modulation or the like.

A transistor TB1 (P-type CMOS transistor) is controlled based on a signal P4Q from an output assurance circuit 54. Specifically, the transistor TB1 is turned ON when ID authentication has been completed and normal power transmission is performed. The transistor TB1 is turned OFF when connection of an AC adaptor has been detected or the power supply voltage VD5 is lower than the operation lower limit voltage of the power reception control device 50 (control circuit 52), for example.

The power reception control device 50 is a device which controls the power reception device 40. The power reception control device 50 may be implemented by the integrated circuit device (IC), and the like according to this embodiment. The power reception control device 50 may operate based on a power supply voltage VD5 generated from the induced voltage in the secondary coil L2. The power reception control device 50 may include the control circuit 52 (power reception side), the output assurance circuit 54, the position detection circuit 56, an oscillation circuit 58, the frequency detection circuit 60, a full-charge detection circuit 62, a digital power supply regulation circuit 70, an analog power supply regulation circuit 72, and a reset circuit 74.

The control circuit 52 (control section) controls the power reception device 40 and the power reception control device 50. The control circuit 52 may be implemented by a gate array, a microcomputer, or the like. Specifically, the control circuit 22 performs sequence control and a determination process necessary for ID authentication, position detection, frequency detection, load modulation, full-charge detection, and the like.

The output assurance circuit 54 is a circuit which assures the output from the power reception device 40 when the voltage is low (0 V). The output assurance circuit 54 prevents a backward current flow from the voltage output node NB7 to the power reception device 40.

The position detection circuit 56 monitors the waveform of the signal ADIN which corresponds to the waveform of the induced voltage in the secondary coil L2, and determines whether or not the positional relationship between the primary coil L1 and the secondary coil L2 is appropriate. Specifically, the position detection circuit 56 converts the signal ADIN into a binary value using a comparator, and determines whether or not the positional relationship between the primary coil L1 and the secondary coil L2 is appropriate.

The oscillation circuit 58 includes a CR oscillation circuit, for example. The oscillation circuit 58 generates a secondary-side clock signal. The frequency detection circuit 60 detects the frequency (f1 or f2) of the signal CCMPI, and determines whether the data transmitted from the power transmission device 10 is "1" or "0", as shown in FIG. 12A.

The full-charge detection circuit 62 (charge detection circuit) is a circuit which detects whether or not a battery 94 (secondary battery) of the load 90 has been full-charged (charged).

The digital power supply regulation circuit 70 is a circuit which regulates a digital power supply voltage. The analog power supply regulation circuit 72 is a circuit which regulates an analog power supply voltage. The reset circuit 74 generates a reset signal and outputs the generated reset signal to each circuit of the power reception control device 50 (integrated circuit device) to implement a power-on reset.

The load 90 includes a charge control device 92 which controls charging the battery 94 and the like. The charge control device 92 (charge control IC) may be implemented by an integrated circuit device or the like. The battery 94 may be provided with the function of the charge control device 92 (e.g., smart battery).

7. Layout of Integrated Circuit Device of Power Transmission Control Device

Figure 13:
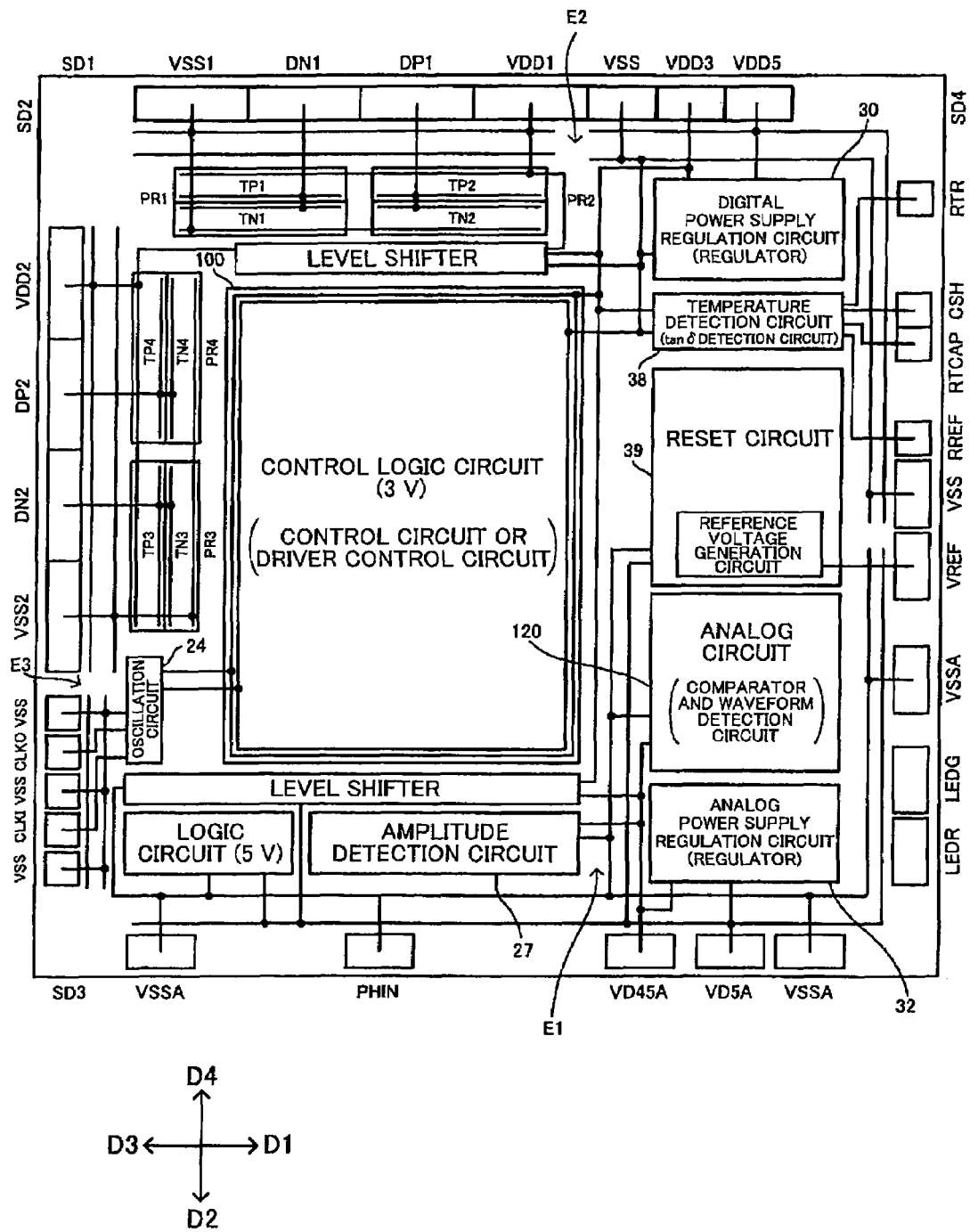
FIG. 13 shows a layout example of an integrated circuit device which implements a power transmission control device.

FIG. 13 shows a detailed layout example of an integrated circuit device which implements the power transmission control device 20 shown in FIG. 11.

The control logic circuit 110 shown in FIG. 13 is a logic circuit which includes logic cells such as a NAND circuit, a NOR circuit, an inverter, and a D flip-flop, and implements the control circuit 22 and the like shown in FIG. 11. The control logic circuit 110 operates based on the digital power supply voltage (e.g., 3 V) regulated by the digital power supply regulation circuit 30 (series regulator). The driver control circuit 26 shown in FIG. 11 is implemented by the control logic circuit 110, the predrivers PR1 to PR4, and the like shown in FIG. 13.

The analog circuit 120 is a circuit which includes comparators and operational amplifiers of various detection circuits such as the waveform detection circuit. The analog circuit 120 operates based on the analog power supply voltage (e.g., 4.5 V) regulated by the analog power supply regulation circuit 32 (series regulator).

The power supply wiring region in which at least the digital power supply line which supplies the digital power supply voltage and the analog power supply line which supplies the analog power supply voltage are provided is formed in an area indicated by E1 in FIG. 13. The digital power supply regulation circuit 30, the analog circuit 120, and the analog power supply regulation circuit 32 are disposed in the direction D1 with respect to the control logic circuit 110. For example, the analog circuit 120 is disposed in the direction D2 with respect to the digital power supply regulation circuit 30, and the analog power supply regulation circuit 32 is disposed in the direction D2 with respect to the analog circuit 120.

The power supply wiring region indicated by E1 is formed along the direction D2 in a region between the control logic circuit 110 and the digital power supply regulation circuit 30, the analog circuit 120, and the analog power supply regulation circuit 32. Specifically, the power supply wiring region is linearly formed along the direction D2 from the side SD1 toward a side SD3 of the integrated circuit device, for example.

This enables the digital circuit (e.g., control logic circuit and predrivers) and the analog circuit to be separated utilizing the power supply wiring region indicated by E1, whereby the distance between the digital circuit and the analog circuit can be increased. This prevents a situation in which switching noise produced by the digital circuit or the like is transmitted to the analog circuit and causes malfunction or deterioration in performance.

In FIG. 13, the first power supply pad, to which the power supply voltage VDD5 regulated by the digital power supply regulation circuit 30 is input, is disposed in the direction D4 with respect to the digital power supply regulation circuit 30. The second power supply pad, to which the power supply voltage VD5A regulated by the analog power supply regulation circuit 32 is input, is disposed in the direction D2 with respect to the analog power supply regulation circuit 32. This enables the power supply voltages VDD5 and VD5A to be respectively supplied to the digital power supply regulation circuit 30 and the analog power supply regulation circuit 32 through short paths. This makes it unnecessary to provide the power supply lines of the power supply voltages VDD5 and VD5A around a core region of the integrated circuit device, so that layout efficiency can be increased.

In FIG. 13, the predrivers PR1 and PR2 are disposed along the side SD1 of the integrated circuit device, and the predrivers PR3 and PR4 are disposed along the side SD2. The predrivers PR1 to PR4 are disposed in the logic circuit region in the direction D3 with respect to the power supply wiring region indicated by E1. Therefore, the VDD1 and VSS1 power supply lines for the predrivers PR1 and PR2 and the VDD2 and VSS2 power supply lines for the predrivers PR3 and PR4 can be easily separated from the power supply lines for other circuits, as indicated by E2 and E3 in FIG. 13. This prevents a situation in which switching noise produced by the predrivers PR1 to PR4 adversely affects other circuits.

Although the embodiments of the invention have been described in detail above, those skilled in the art would readily appreciate that many modifications are possible in the embodiments without materially departing from the novel teachings and advantages of the invention. Accordingly, such modifications are intended to be included within the scope of the invention. Any term (e.g., P-type power MOS transistor, N-type power MOS transistor, and external driver) cited with a different term (e.g., P-type transistor, N-type transistor, and external device) having a broader meaning or the same meaning at least once in the specification and the drawings can be replaced by the different term in any place in the specification and the drawings. The invention also includes any combination of the embodiments and the modifications. The configurations, arrangements, and operations of the integrated circuit device, the predriver, and the power transmission device and the transistor ON/OFF control method are not limited to those described relating to the above embodiments. Various modifications and variations may be made.

Although only some embodiments of the invention have been described in detail above, those skilled in the art would readily appreciate that many modifications are possible in the embodiments without materially departing from the novel teachings and advantages of the invention. Accordingly, such modifications are intended to be included within the scope of the invention.

What is claimed is:

1. An integrated circuit device comprising:
   a first predriver that drives an N-type power MOS transistor of an external driver including the N-type power MOS transistor and a P-type power MOS transistor;
   a second predriver that drives the P-type power MOS transistor of the external driver;
   a low-potential-side power supply pad, a low-potential-side power supply voltage being supplied to the first predriver and the second predriver through the low-potential-side power supply pad;

a first output pad, an output signal from the first predriver being output through the first output pad;

a second output pad, an output signal from the second predriver being output through the second output pad; and a high-potential-side power supply pad, a high-potential-side power supply voltage being supplied to the first predriver and the second predriver through the high-potential-side power supply pad, the low-potential-side power supply pad, the first output pad, the second output pad, and the high-potential-side power supply pad being disposed along a first direction;

the first predriver being disposed in a second direction with respect to the low-potential-side power supply pad and the first output pad, the second direction being a direction that is perpendicular to the first direction; and the second predriver being disposed in the second direction with respect to the second output pad and the high-potential-side power supply pad.

2. The integrated circuit device as defined in claim 1, the integrated circuit device further including:

a low-potential-side power supply line that supplies the low-potential-side power supply voltage to the first predriver and the second predriver, the low-potential-side power supply line being provided along the first direction in arrangement regions of the first predriver and the second predriver;

a first connection line that connects the low-potential-side power supply pad and the low-potential-side power supply line, the first connection line being provided along the second direction from the low-potential-side power supply pad to a low-potential-side power supply connection node of the first predriver;

a first output line that is connected to an output of the first predriver, the first output line being provided along the first direction in the arrangement region of the first predriver;

a second connection line that connects the first output pad and the first output line, the second connection line being provided along the second direction from the first output pad to an output connection node of the first predriver;

a second output line that is connected to an output of the second predriver, the second output line being provided along the first direction in the arrangement region of the second predriver;

a third connection line that connects the second output pad and the second output line, the third connection line being provided along the second direction from the second output pad to an output connection node of the second predriver;

a high-potential-side power supply line that supplies the high-potential-side power supply voltage to the first predriver and the second predriver, the high-potential-side power supply line being provided along the first direction in the arrangement regions of the first predriver and the second predriver; and a fourth connection line that connects the high-potential-side power supply pad and the high-potential-side power supply line, the fourth connection line being provided along the second direction from the high-potential-side power supply pad to a high-potential-side power supply connection node of the second predriver.

3. The integrated circuit device as defined in claim 1, a low-potential-side power supply line and a high-potential-side power supply line of the first predriver and the second predriver being separated from a low-potential-side power supply line and a high-potential-side power supply line of other circuits of the integrated circuit device.

4. The integrated circuit device as defined in claim 1, an electrostatic discharge protection region being provided between a region that includes the low-potential-side power supply pad, the first output pad, the second output pad, and the high-potential-side power supply pad and a region that includes the first predriver and the second predriver, a predriver electrostatic discharge protection element being disposed in the electrostatic discharge protection region;

an electrostatic discharge protection low-potential-side power supply line being provided along the first direction in the electrostatic discharge protection region, the electrostatic discharge protection low-potential-side power supply line being connected to the low-potential-side power supply pad and supplying the low-potential-side power supply voltage to the predriver electrostatic discharge protection element;

an electrostatic discharge protection high-potential-side power supply line being provided along the first direction in the electrostatic discharge protection region, the electrostatic discharge protection high-potential-side power supply line being connected to the high-potential-side power supply pad and supplying the high-potential-side power supply voltage to the predriver electrostatic discharge protection element; and the electrostatic discharge protection low-potential-side power supply line and the electrostatic discharge protection high-potential-side power supply line being separated from an electrostatic discharge protection low-potential-side power supply line and an electrostatic discharge protection high-potential-side power supply line of other circuits of the integrated circuit device.

5. The integrated circuit device as defined in claim 1, a first P-type transistor and a first N-type transistor that form the first predriver being disposed along the second direction in an arrangement region of the first predriver; and a second P-type transistor and a second N-type transistor that form the second predriver being disposed along the second direction in an arrangement region of the second predriver.

6. The integrated circuit device as defined in claim 5, each of the first N-type transistor, the first P-type transistor, the second N-type transistor, and the second P-type transistor including a plurality of unit transistors that are connected in parallel; and the integrated circuit device further including:

a first N-type gate control circuit that outputs a plurality of gate control signals that are respectively input to gates of the plurality of unit transistors of the first N-type transistor;

a first P-type gate control circuit that outputs a plurality of gate control signals that are respectively input to gates of the plurality of unit transistors of the first P-type transistor;

a second N-type gate control circuit that outputs a plurality of gate control signals that are respectively input to gates of the plurality of unit transistors of the second N-type transistor; and a second P-type gate control circuit that outputs a plurality of gate control signals that are respectively input to gates of the plurality of unit transistors of the second P-type transistor.

7. The integrated circuit device as defined in claim 6, the first N-type gate control circuit outputting gate control signals that turn ON the plurality of unit transistors of the first N-type transistor at different timings when the first N-type transistor turns ON, the first N-type gate control circuit outputting gate control signals that turn OFF the plurality of unit transistors of the first N-type transistor at the same timing when the first N-type transistor turns OFF;

the first P-type gate control circuit outputting gate control signals that turn ON the plurality of unit transistors of the first P-type transistor at different timings when the first P-type transistor turns ON, the first P-type gate control circuit outputting gate control signals that turn OFF the plurality of unit transistors of the first P-type transistor at the same timing when the first P-type transistor turns OFF;

the second N-type gate control circuit outputting gate control signals that turn ON the plurality of unit transistors of the second N-type transistor at different timings when the second N-type transistor turns ON, the second N-type gate control circuit outputting gate control signals that turn OFF the plurality of unit transistors of the second N-type transistor at the same timing when the second N-type transistor turns OFF; and the second P-type gate control circuit outputting gate control signals that turn ON the plurality of unit transistors of the second P-type transistor at different timings when the second P-type transistor turns ON, the second P-type gate control circuit outputting gate control signals that turn OFF the plurality of unit transistors of the second P-type transistor at the same timing when the second P-type transistor turns OFF.

8. The integrated circuit device as defined in claim 6, one of the first N-type gate control circuit and the first P-type gate control circuit being disposed in the second direction with respect to the plurality of unit transistors of the first N-type transistor and the plurality of unit transistors of the first P-type transistor, and the other of the first N-type gate control circuit and the first P-type gate control circuit being disposed in a fourth direction with respect to the plurality of unit transistors of the first N-type transistor and the plurality of unit transistors of the first P-type transistor, the fourth direction being a direction that is opposite to the second direction; and one of the second N-type gate control circuit and the second P-type gate control circuit being disposed in the second direction with respect to the plurality of unit transistors of the second N-type transistor and the plurality of unit transistors of the second P-type transistor, and the other of the second N-type gate control circuit and the second P-type gate control circuit being disposed in the fourth direction with respect to the plurality of unit transistors of the second N-type transistor and the plurality of unit transistors of the second P-type transistor.

9. The integrated circuit device as defined in claim 1, the integrated circuit device further including:

a third predriver that drives a second N-type power MOS transistor of a second external driver including the second N-type power MOS transistor and a second P-type power MOS transistor; and a fourth predriver that drives the second P-type power MOS transistor of the second external driver, the first predriver and the second predriver being disposed along a first side of the integrated circuit device, the first side being a side of the integrated circuit device along the first direction; and the third predriver and the fourth predriver being disposed along a second side of the integrated circuit device, the second side being a side of the integrated circuit device along the second direction.

10. An integrated circuit device comprising:

a first predriver that drives an N-type power MOS transistor of an external driver including the N-type power MOS transistor and a P-type power MOS transistor;

a second predriver that drives the P-type power MOS transistor of the external driver;

a third predriver that drives a second N-type power MOS transistor of a second external driver including the second N-type power MOS transistor and a second P-type power MOS transistor;

a fourth predriver that drives the second P-type power MOS transistor of the second external driver;

a first output pad, an output signal from the first predriver being output through the first output pad;

a second output pad, an output signal from the second predriver being output through the second output pad;

a third output pad, an output signal from the third predriver being output through the third output pad; and a fourth output pad, an output signal from the fourth predriver being output through the fourth output pad, the first predriver and the second predriver being disposed along a first side of the integrated circuit device, the first side being a side of the integrated circuit device along a first direction; and the third predriver and the fourth predriver being disposed along a second side of the integrated circuit device, the second side being a side of the integrated circuit device along a second direction that is perpendicular to the first direction.

11. The integrated circuit device as defined in claim 9, the integrated circuit device further including a control logic circuit that controls the first predriver, the second predriver, the third predriver, and the fourth predriver, the control logic circuit being disposed in the second direction with respect to the first predriver and the second predriver and in the first direction with respect to the third predriver and the fourth predriver.

12. The integrated circuit device as defined in claim 10, the integrated circuit device further including a control logic circuit that controls the first predriver, the second predriver, the third predriver, and the fourth predriver, the control logic circuit being disposed in the second direction with respect to the first predriver and the second predriver and in the first direction with respect to the third predriver and the fourth predriver.

13. The integrated circuit device as defined in claim 10, the integrated circuit device being provided in a power transmission device of a non-contact power transmission system, the non-contact power transmission system transmitting power from the power transmission device to a power reception device by electromagnetically coupling a primary coil and a secondary coil and supplying power to a load of the power reception device, the external driver being a first power transmission driver that drives one end of the primary coil; and the second external driver being a second power transmission driver that drives the other end of the primary coil.

14. An integrated circuit device comprising:
a driver that drives an external device;
a low-potential-side power supply pad, a low-potential-side power supply voltage being supplied to the driver through the low-potential-side power supply pad;
an output pad, an output signal from the driver being output through the output pad; and
a high-potential-side power supply pad, a high-potential-side power supply voltage being supplied to the driver through the high-potential-side power supply pad,
the low-potential-side power supply pad, the output pad, and the high-potential-side power supply pad being disposed along a first direction;
the driver being disposed in a second direction with respect to the low-potential-side power supply pad, the output pad, and the high-potential-side power supply pad, the second direction being a direction perpendicular to the first direction;
a P-type transistor and an N-type transistor that form the driver being disposed along the second direction in an arrangement region of the driver;
each of the N-type transistor and the P-type transistor including a plurality of unit transistors that are connected in parallel; and
the integrated circuit device further including:
an N-type gate control circuit that outputs a plurality of gate control signals that are respectively input to gates of the plurality of unit transistors of the N-type transistor; and
a P-type gate control circuit that outputs a plurality of gate control signals that are respectively input to gates of the plurality of unit transistors of the P-type transistor.

15. The integrated circuit device as defined in claim 14,
the N-type gate control circuit outputting gate control signals that turn ON the plurality of unit transistors of the N-type transistor at different timings when the N-type transistor turns ON, the N-type gate control circuit outputting bate control signals that turn OFF the plurality of unit transistors of the N-type transistor at the same timing when the N-type transistor turns OFF; and
the P-type gate control circuit outputting gate control signals that turn ON the plurality of unit transistors of the P-type transistor at different timings when the P-type transistor turns ON, the P-type gate control circuit outputting gate control signals those turn OFF the plurality of unit transistors of the P-type transistor at the same timing when the P-type transistor turns OFF.

16. The integrated circuit device as defined in claim 14,
one of the N-type gate control circuit and the P-type gate control circuit being disposed in the second direction with respect to the plurality of unit transistors of the N-type transistor and the plurality of unit transistors of the P-type transistor, and the other of the N-type gate control circuit and the P-type gate control circuit being disposed in a fourth direction with respect to the plurality of unit transistors of the N-type transistor and the plurality of unit transistors of the P-type transistor, the fourth direction being a direction opposite to the second direction.

17. An electronic instrument comprising:
the integrated circuit device as defined in claim 1; and
a device that is driven by the integrated circuit device.

18. An electronic instrument comprising:
the integrated circuit device as defined in claim 10; and
a device that is driven by the integrated circuit device.

19. An electronic instrument comprising:
the integrated circuit device as defined in claim 14; and
a device that is driven by the integrated circuit device.

* * * * *